US011042124B2

(12) United States Patent
Ikeda

(10) Patent No.: US 11,042,124 B2
(45) Date of Patent: Jun. 22, 2021

(54) TIMEPIECE COMPONENT AND METHOD OF MANUFACTURING TIMEPIECE COMPONENT

(71) Applicant: CITIZEN WATCH CO., LTD., Nishitokyo (JP)

(72) Inventor: Tomoo Ikeda, Shiraoka (JP)

(73) Assignee: CITIZEN WATCH CO., LTD., Tokyo (JP)

( * ) Notice: Subject to any disclaimer, the term of this patent is extended or adjusted under 35 U.S.C. 154(b) by 0 days.

(21) Appl. No.: 15/533,463

(22) PCT Filed: Dec. 11, 2015

(86) PCT No.: PCT/JP2015/084840
§ 371 (c)(1),
(2) Date: Jun. 6, 2017

(87) PCT Pub. No.: WO2016/093354
PCT Pub. Date: Jun. 16, 2016

(65) Prior Publication Data

US 2017/0371300 A1 Dec. 28, 2017

(30) Foreign Application Priority Data

Dec. 12, 2014 (JP) ............................ JP2014-251863

(51) Int. Cl.
*G04B 17/06* (2006.01)
*G04B 15/14* (2006.01)
(Continued)

(52) U.S. Cl.
CPC ........... *G04B 17/063* (2013.01); *C25D 13/12* (2013.01); *G04B 13/02* (2013.01); *G04B 15/14* (2013.01);
(Continued)

(58) Field of Classification Search
CPC ...... G04B 15/14; G04B 13/02; G04B 17/063; G04B 17/08; G04B 31/06; G04B 13/002; C25D 13/12
See application file for complete search history.

(56) References Cited

U.S. PATENT DOCUMENTS 1,977,458 A * 10/1934 Stargardter ............... F16F 1/10 267/156
3,396,450 A * 8/1968 Faehndrich .......... G04B 17/345 264/279.1
(Continued)

FOREIGN PATENT DOCUMENTS

CH 705 433 B1 3/2013
CN 101675392 A 3/2010
(Continued)

OTHER PUBLICATIONS

Electroforming—en.wikipedia.org/wiki/Electroforming—Apr. 9, 2018.*
(Continued)

*Primary Examiner* — Sean Kayes
(74) *Attorney, Agent, or Firm* — Foley & Lardner LLP

(57) ABSTRACT

By configuring a timepiece component to include an intermediate film provided on at least a portion of a surface of a base material formed by using a nonconductive first material as a main component and to include a buffer film stacked on the intermediate film and mainly composed of a second material having a tenacity higher than that of the first material, the timepiece component may be manufactured with high precision, the weight thereof may be reduced, and even when the base material is formed by using a brittle material such as silicon, the timepiece component becomes resistant to breakage and capable of exhibiting high strength when an impact is externally applied.

15 Claims, 19 Drawing Sheets

(51) Int. Cl.

| | |
|---|---|
| ***G04B 31/06*** | (2006.01) |
| ***C25D 13/12*** | (2006.01) |
| ***G04B 13/02*** | (2006.01) |
| *G04B 13/00* | (2006.01) |
| *G04B 17/08* | (2006.01) |

(52) U.S. Cl.

CPC ............ *G04B 31/06* (2013.01); *G04B 13/002* (2013.01); *G04B 17/08* (2013.01)

(56) References Cited

U.S. PATENT DOCUMENTS

| | | | | |
|---|---|---|---|---|
| 8,343,584 | B2 * | 1/2013 | Kawakami | B44D 5/00 427/250 |
| 8,528,421 | B2 * | 9/2013 | Cerutti | G04D 7/10 73/862.08 |
| 8,636,403 | B2 * | 1/2014 | Maier | B81C 99/0085 368/148 |
| 8,747,993 | B2 * | 6/2014 | Sato | G04B 15/14 428/157 |
| 9,197,183 | B2 * | 11/2015 | Fussinger | H03H 3/0072 |
| 10,162,310 | B2 * | 12/2018 | Dubois | C23C 28/345 |
| 2002/0191493 | A1 | 12/2002 | Hara | |
| 2007/0180943 | A1 | 8/2007 | Daout | |
| 2009/0116343 | A1 * | 5/2009 | Levingston | F16F 1/10 368/140 |
| 2010/0005659 | A1 | 1/2010 | Dinger et al. | |
| 2010/0054089 | A1 | 3/2010 | Maier et al. | |
| 2010/0243603 | A1 | 9/2010 | Fiaccabrino et al. | |
| 2012/0008468 | A1 | 1/2012 | Bossart et al. | |
| 2013/0051191 | A1 | 2/2013 | Schafroth | |
| 2013/0176829 | A1 | 7/2013 | Cusin et al. | |
| 2013/0279307 | A1 * | 10/2013 | Fiaccabrino | G04B 13/022 368/323 |
| 2014/0219067 | A1 | 8/2014 | Hessler | |
| 2014/0254111 | A1 * | 9/2014 | Yamazaki | H01L 51/0097 361/749 |
| 2015/0309476 | A1 * | 10/2015 | Rhul | G04D 7/004 29/896.31 |
| 2015/0355600 | A1 | 12/2015 | Cusin et al. | |
| 2016/0109852 | A1 * | 4/2016 | Kuwabara | G04B 19/00 368/223 |

FOREIGN PATENT DOCUMENTS

| | | | |
|---|---|---|---|
| CN | 101861281 | A | 10/2010 |
| EP | 2 765 705 | A1 | 8/2014 |
| JP | 2004-502910 | A | 1/2004 |
| JP | 2008-020265 | A | 1/2008 |
| JP | 2010-19844 | A | 1/2010 |
| JP | 4851945 | B2 | 1/2012 |
| JP | 2012-21984 | A | 2/2012 |
| JP | 2012-63162 | A | 3/2012 |
| JP | 2013-525778 | A | 6/2013 |
| JP | 2013-531257 | A | 8/2013 |
| JP | 2013-210386 | A | 10/2013 |

OTHER PUBLICATIONS

European Search Report, dated Jul. 2, 2018, 7 pages.
Chinese Office Action, dated Nov. 5, 2018, 7 pages.
Chinese Office Action and English translation, Application No. 201580066893.2, dated Jul. 29, 2019, 18 pages.
European Office Action, Application No. 15 867 807.8, dated Jun. 19, 2020, 4 pages.
Chinese Office Action and English translation, Application 201580066893.2, dated Mar. 9, 2020, 15 pages.
Chinese Office Action and machines translation, Application No. 201580066893.2, dated Sep. 28, 2020, 10 pages.

* cited by examiner

TIMEPIECE COMPONENT AND METHOD OF MANUFACTURING TIMEPIECE COMPONENT

TECHNICAL FIELD

The present invention relates to a timepiece component constituting a machine component in a timepiece and a method of manufacturing a timepiece component.

BACKGROUND ART

In a mechanical timepiece, a speed governor (balance) is conventionally used that is made up of a hairspring and a balance wheel (with a balance staff) and that operates a drive mechanism (movement) while keeping a constant speed with regularity. The balance wheel regularly performs a reciprocating rotary motion according to extension and contraction of a so-called isochronous hairspring keeping a constant speed with regularity. To the balance, an escapement made up of an escape wheel and an anchor is coupled, and energy from the hairspring is transferred to sustain operation (vibration).

In general, a hairspring formed by processing metal is widely known. A hairspring formed by processing metal may not be shaped as designed in some cases due to variations in processing accuracy, effects of internal stress of metal, etc. If the hairspring required to regularly vibrate the balance cannot be formed in a shape as designed, the balance wheel cannot perform the isochronous motion. In this case, deviation in the so-called rate of the timepiece occurs expressed as a certain amount of advance or delay of the timepiece per day.

In recent years, attempts have been made to manufacture a timepiece component by etching processing of a silicon substrate. The timepiece component formed by etching processing of a silicon substrate may be reduced in weight as compared to timepiece components formed by using conventional metal components. Additionally, the timepiece component formed by etching processing of a silicon substrate may be mass-produced with precision. Therefore, small lightweight timepieces are expected to be manufactured by using timepiece components formed by etching processing of a silicon substrate.

A reactive ion etching (RIE) technique is a dry etching technique and may be used for etching a silicon substrate. RIE techniques have advanced in recent years and, among the RIE techniques, a Deep RIE technique has been developed to enable etching with a high aspect ratio. By etching a silicon substrate by using the RIE technique, a mask pattern may be faithfully reproduced in a vertical depth direction without etching going under a portion masked by photoresist, etc., and a timepiece component having a shape as designed may be manufactured accurately.

A timepiece component formed by using silicon has better temperature characteristics than metal and is more resistant to deformation resulting from environmental temperature as compared to a conventional hairspring formed by using metal. Therefore, it is conceivable that a dry etching technique such as the RIE technique may be applied to a timepiece component constituting a speed governing mechanism of a timepiece. On the other hand, since silicon is a brittle material, a timepiece component formed by using silicon may be damaged when subject to a strong impact.

To eliminate such trouble, in a conventional technique, for example, an opening portion is provided in an upper surface of a spring unit forming one flat surface in a planar view of a hairspring so as to reduce the mass of the hairspring, so that the hairspring is minimally affected by impacts while rigidity equivalent to a hairspring without the opening portion is maintained (see, for example, Patent Document 1).

Patent Document 1: Japanese Laid-Open Patent Publication No. 2012-21984

DISCLOSURE OF INVENTION

Problem to be Solved by the Invention

However, the conventional technique described in Patent Document 1 described above has a problem in that since the provision of the opening portion reduces a thickness of a portion of the opening portion, the strength around the opening portion becomes insufficient and may result in damage of the hairspring when the timepiece is subject to a strong impact. In particular, for example, the size of the hairspring varies depending on the size, etc. of the timepiece incorporating the hairspring and, in the case of a typical wristwatch, a hairspring with a diameter of about 5 mm to 8 mm is used.

In a hairspring having such a diameter, the width of the upper surface of the portion constituting the spring unit is several dozen μm, and the conventional technique described in the patent document 1 described above has a problem in that since the opening portion is provided in such a thin portion, the spring unit is more susceptible to damage. Such a hairspring is damaged, for example, when the timepiece is subject to a strong force, resulting in contact between adjacent coil-shaped spring units.

Additionally, when some kind of impact is applied to a hairspring formed by using a brittle material such as silicon, stress concentrates at a corner of the hairspring. Therefore, when the timepiece is subject to a strong impact, the corner of the hairspring chips or cracks due to the force. If the hairspring is damaged or a portion thereof is chipped, the balance wheel cannot perform a regular reciprocating rotary motion and becomes unable to function as a timepiece. Moreover, a broken piece of the damaged hairspring entering a drive mechanism causes a problem in that a fatal failure may occur in the timepiece itself.

To solve the problems of the conventional technique described above, it is an object of the present invention to provide a timepiece component and a method of manufacturing a timepiece component that is highly accurate in terms of manufacturing, that enables a weight reduction, and that is resistant to breaking and capable of exhibiting high strength even when a strong external impact is applied.

Means for Solving Problem

To solve the problems above and achieve an object, according to the present invention, a timepiece component constituting a timepiece, includes a base material formed using a nonconductive first material as a main component; an intermediate film provided on at least a portion of a surface of the base material; and a buffer film stacked on the intermediate film and mainly composed of a second material having a tenacity higher than that of the first material.

In the timepiece component, the first material is silicon.

In the timepiece component, the second material is a resin.

In the timepiece component, the base material includes a stepped portion on an outer surface, and the intermediate film is provided at a position covering at least the stepped portion.

In the timepiece component, the timepiece component is a hairspring constituting a speed governing mechanism of a driving unit of a mechanical timepiece.

In the timepiece component, the timepiece component is one of a gear, an anchor, and a balance wheel constituting a driving unit of a timepiece and having a hole into which another member is fitted.

According to another aspect of the present invention, a method of manufacturing a timepiece component, includes forming a base material into a shape of a timepiece component by etching a substrate formed using a nonconductive first material as a main component; forming an intermediate film on at least a portion of a surface of the base material; and forming a buffer film by stacking on the intermediate film, a material mainly composed of a second material having a tenacity higher than that of the first material.

The method further includes forming a stepped portion on the surface of the base material, where the forming of the intermediate film is performed after the forming of the stepped portion.

In the method, the forming of the buffer film includes forming the buffer film by applying a predetermined voltage to the intermediate film after the base material having the intermediate film formed thereon is immersed in a predetermined electrodeposition liquid.

Effect of the Invention

The timepiece component and the method of manufacturing a timepiece component according to the present invention provides an effect of being highly accurate in terms of manufacturing while enabling a weight reduction and resistance to breaking, and exhibiting high strength even when an external force is applied.

BEST MODE(S) FOR CARRYING OUT THE INVENTION

Embodiments of a timepiece component and a method of manufacturing a timepiece component according to the present invention will be described in detail with reference to the accompanying drawings.

First Embodiment (Drive Mechanism of Mechanical Timepiece)

Figure 1:
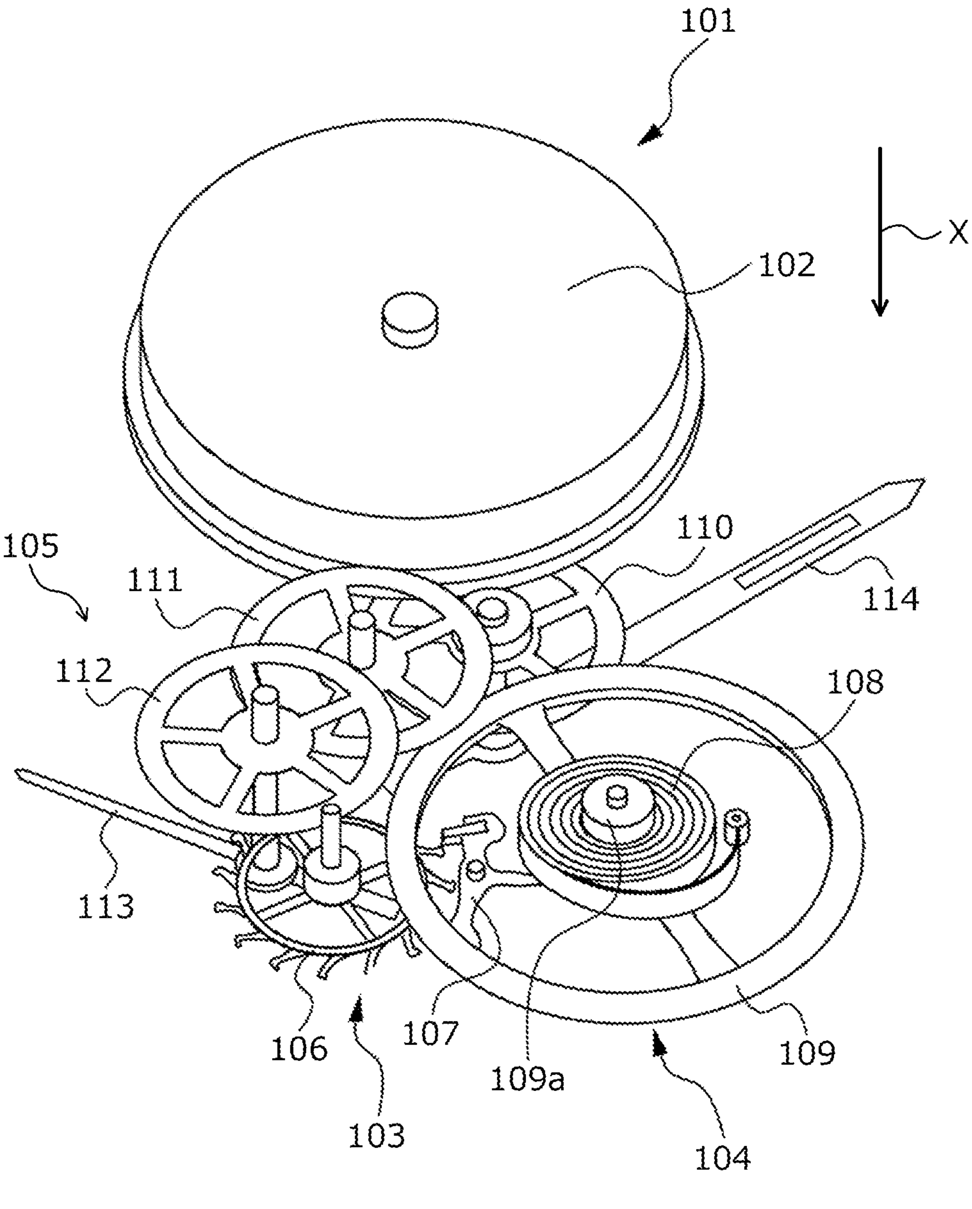
FIG. 1 is an explanatory view of a drive mechanism of a mechanical timepiece.

First, a drive mechanism of a mechanical timepiece will be described as a drive mechanism of a timepiece incorporating a timepiece component of a first embodiment according to the present invention manufactured by a manufacturing method of the first embodiment according to the present invention. FIG. 1 is an explanatory view of a drive mechanism of a mechanical timepiece. FIG. 1 depicts the drive mechanism of the mechanical timepiece incorporating the timepiece component of the first embodiment according to the present invention manufactured by the manufacturing method of the first embodiment according to the present invention.

In FIG. 1, a drive mechanism 101 of the mechanical timepiece incorporating the timepiece component manufactured by the manufacturing method of the first embodiment according to the present invention includes a barrel 102, an escapement 103, a speed governing mechanism (balance) 104, a train wheel 8 (drive train wheel) 105, etc. The barrel 102 houses a power mainspring not depicted inside a box forming a thin cylindrical shaped. A gear called a barrel wheel is provided on an outer circumferential portion of the barrel 102 and meshes with a wheel and pinion constituting the train wheel 105.

The power mainspring is an elongated thin metal sheet in a wound state and is housed in the barrel 102. An end portion at the center of the power mainspring (an end portion located on the inner circumferential side in the wound state) is attached to a center axis (barrel arbor) of the barrel 102. An outer end portion (an end portion located on the outer circumferential side in the wound state) of the power mainspring is attached to an inner surface of the barrel 102.

The escapement 103 is made up of an escape wheel 106 and an anchor 107. The escape wheel 106 is a gear including key-shaped teeth, and the teeth of the escape wheel 106 mesh with the anchor 107. The anchor 107 converts the rotary motion of the escape wheel 106 into reciprocating motion by meshing with the teeth of the escape wheel 106.

The balance 104 is made up of a hairspring 108, a balance wheel 109, etc. The hairspring 108 and the balance wheel 109 are coupled by a balance staff **109*a* provided at the center of the balance wheel 109. The hairspring 108 is an elongated member in a wound state and has a spiral shape (see FIG. 2). The hairspring 108 is designed to exhibit high isochronism in a state of being incorporated in the mechanical timepiece to constitute the drive mechanism 101**

The balance 104 may regularly reciprocate according to expansion and contraction due to a spring force of the hairspring 108. The balance wheel 109 forms a ring shape and adjusts/controls the repetitive motion from the anchor 107 to keep vibration at a constant speed. The balance wheel 109 is provided with arms extending radially from the balance staff **109*a* inside the ring shape formed by the balance wheel 109**.

The train wheel 105 is provided between the barrel 102 and the escape wheel 106 and is made up of multiple gears meshing with each other. For example, the train wheel 105 is made up of a center wheel and pinion 110, a third wheel and pinion 111, a fourth wheel and pinion 112, etc. The barrel wheel of the barrel 102 meshes with the center wheel and pinion 110. A second hand 113 is mounted on the fourth wheel and pinion 112, and a minute hand 114 is mounted on the center wheel and pinion 110. In FIG. 1, an hour hand, a bottom plate supporting the gears, etc. are not depicted.

In the drive mechanism 101, the center of the power mainspring is fixed to the center (barrel arbor) of the barrel 102 so as not to rotate backward and the outer end portion of the power mainspring is fixed to the inner circumferential surface of the barrel, so that when the power mainspring wound around the center (barrel arbor) of the barrel 102 attempts to return to an original state, the barrel 102 is urged by the outer end portion of the power mainspring attempting to loosen in the same direction as the wound-up direction and rotates in the same direction as the loosening direction of the wound-up mainspring. The rotation of the barrel 102 is sequentially transmitted through the center wheel and pinion 110, the third wheel and pinion 111, and the fourth wheel and pinion 112 and is transmitted from the fourth wheel and pinion 112 to the escape wheel 106.

Since the escape wheel 106 is meshed with the anchor 107, when the escape wheel 106 rotates, a tooth (impact surface) of the escape wheel 106 pushes up an entry pallet of the anchor 107 and, as a result, the balance 104 is rotated by a tip of the anchor 107 on the balance 104 side. When the balance 104 rotates, an exit pallet of the anchor 107 immediately stops the escape wheel 106. When the balance 104 rotates backward due to the force of the hairspring 108, the entry pallet of the anchor 107 is released and the escape wheel 106 rotates again.

In this way, the speed governing mechanism 104 causes the balance 104 to repeat the regular reciprocating rotary motion according to the expansion and contraction of the isochronous hairspring 108, and the escapement 103 continuously gives the force for reciprocation to the balance 104 and rotates the gears in the train wheel 105 at constant speed according to the regular vibrations from the balance 104. The escape wheel 106, the anchor 107, and the balance 104 constitute a speed governing mechanism converting the reciprocating motion of the balance 104 into the rotary motion.

(Structure of Hairspring 108)

Figure 2:
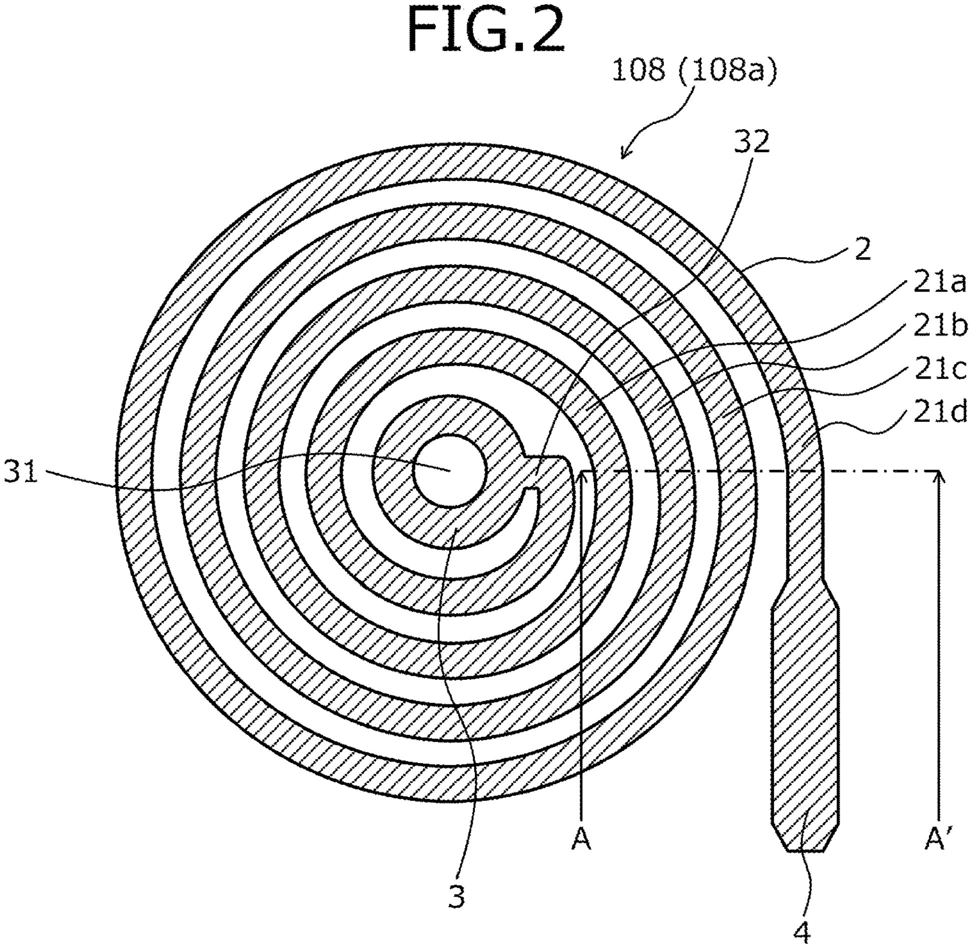
FIG. 2 is an explanatory view of a structure of a hairspring of a first embodiment according to the present invention.

FIG. 2 is an explanatory view of the structure of the hairspring 108 of the first embodiment according to the present invention. FIG. 2 depicts a plane view of the hairspring 108 of the first embodiment in a direction of an arrow X in FIG. 1. In particular, FIG. 2 depicts the hairspring 108 in a state of a planar view in an axial direction of a rotating shaft body such as the gears 110 to 112 constituting the train wheel 105. In the following description, the hairspring 108 of the first embodiment will be denoted by reference character **108*a***.

In FIG. 2, the hairspring **108*a* is made up of a collet 3, a spring unit 2, and a stud 4. The collet 3 is included as the collet 3 having a through-hole 31 at the center portion for fitting a balance staff that is a rotating shaft body. The spring unit 2 has a coil shape designed to be wound around the collet 3 with the through-hole 31 of the collet 3 located at the center. The stud 4 is connected to the end of winding of the spring unit 2. The spring unit 2 is connected to the collet 3 via a connection portion 32** at a winding start portion.

Figure 3:
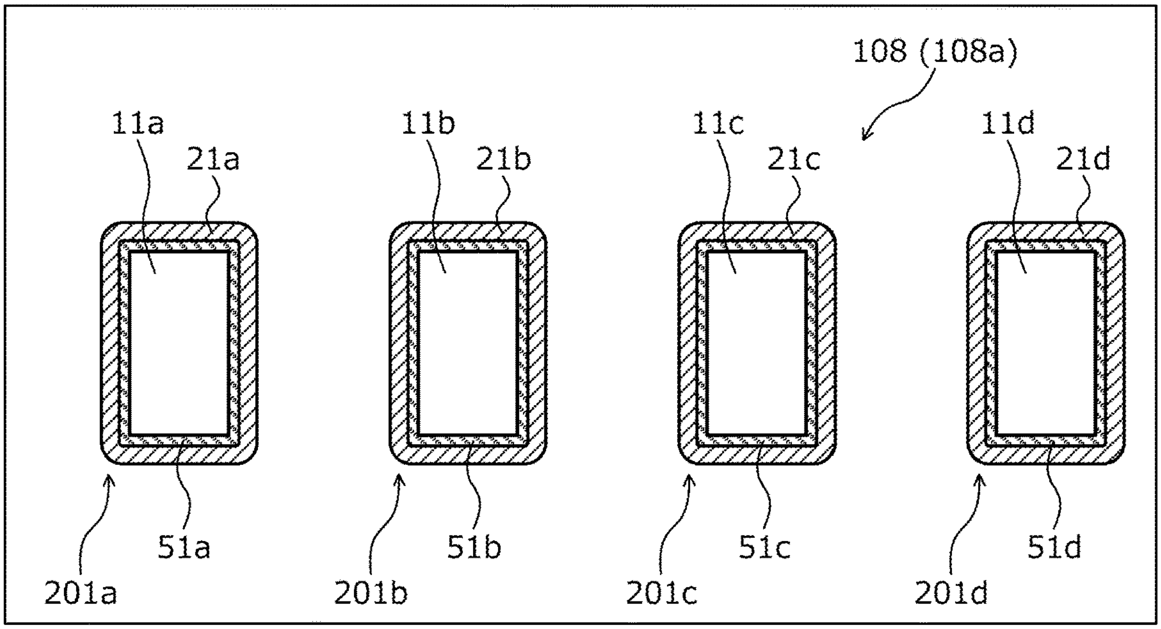
FIG. 3 is an explanatory view of a cross-section taken along A-A' in FIG. 2.

FIG. 3 is an explanatory view of a cross-section taken along A-A' in FIG. 2. FIG. 3 is an enlarged view of four rounding portions of the spring unit 2. As depicted in FIG. 3, the spring unit 2 has a single structure formed by connecting spring arms 201*a*, 201*b*, 201*c*, and 201*d* from an inner circumference.

In the spring arm 201, the spring arm 201*a* is located at the innermost circumferential side of the spring unit 2 with the spring arm 201*b* and spring arm 201*c* located in order from the inner circumferential side toward the outer circumferential side, and the spring arm 201*d* is located on the outermost circumferential side of the spring unit 2. Each of the spring arms 201*a* to 201*d* may be 50 μm in width and 100 μm in height, for example.

The spring arms 201*a* to 201*d* are made up of intermediate films 51*a*, 51*b*, 51*c*, 51*d* and buffer films 21*a*, 21*b*, 21*c*, 21*d* sequentially stacked on surfaces of base materials 11*a*, 11*b*, 11*c*, 11*d*. The buffer films 21*a* to 21*d* are formed on the outermost surface of the hairspring 108*a*. As described above, the spring arms 201*a* to 201*d* form a single integrated structure, and the base materials 11*a* to 11*d* therefore form a single structure as well. Similarly, the intermediate films 51*a* to 51*d* also form a single structure, and the buffer films 21*a* to 21*d* form a single structure as well.

The base materials 11*a* to 11*d* are formed by using a first material. For the first material, for example, a material mainly composed of quartz, ceramics, silicon, silicon oxide, etc. may be used. By using silicon as the first material for forming the base materials 11*a* to 11*d*, the hairspring 108*a* may be reduced in weight.

Additionally, by using silicon as the first material 11 for forming the base materials 11*a* to 11*d*, favorable processability may be ensured in manufacturing of the hairspring 108*a*. For example, by using silicon as the first material 11 for forming the base materials 11, the hairspring 108*a* may be manufactured by using a Deep RIE technique.

The Deep RIE technique is generally frequently used as a semiconductor manufacturing technique. The Deep RIE technique is a kind of reactive ion etching that is a kind of dry etching processing, and is widely known as a technique capable of microfabrication with high precision. By processing a silicon substrate through dry etching using the Deep RIE technique, the hairspring 108*a* may be manufactured with high precision. By manufacturing the hairspring 108*a* by using the Deep RIE technique, the spring unit 2, the collet 3, and the stud 4 may integrally be formed.

The intermediate films 51*a* to 51*d* are formed by using a material having a tenacity higher than that of the first material forming the base materials 11*a* to 11*d*. The tenacity indicates a property of being hard to break against an external pressure, or so-called "toughness". Materials having high tenacity exhibit favorable toughness. For example, the intermediate films 51*a* to 51*d* may be formed by using, for example, silicon oxide ($SiO_2$), alumina (aluminum oxide: $Al_2O_3$), or DLC (Diamond-Like Carbon).

The intermediate films 51*a* to 51*d* formed of silicon oxide include a natural oxide film formed of silicon oxide formed by exposing silicon to the atmosphere. DLC is mainly composed of carbon (C) isotopes and hydrocarbons and forms an amorphous structure. DLC is a hard film and includes those having a conductivity imparted thereto by various methods such as implanting plasma ions and adding metal elements by sputtering in recent years.

The intermediate films 51*a* to 51*d* may have a conductivity and may be formed by using a metal material such as copper (Cu), gold (Au), nickel (Ni), and titanium (Ti), for example. In particular, the intermediate films 51*a* to 51*d* may be formed by using an alloy acquired by mixing multiple materials.

For example, the intermediate films 51*a* to 51*d* may be formed, for example, by forming films of copper (Cu) with a thickness of 0.2 μm on the surfaces of the base materials 11*a* to 11*d*. Alternatively, for example, the intermediate films 51*a* to 51*d* may be achieved as natural oxide films formed by exposing silicon forming the base materials 11*a* to 11*d* to the atmosphere.

The material forming the intermediate films 51*a* to 51*d* may be set appropriately depending on the hardness required for the timepiece component such as the hairspring 108*a*, for example. The hardness required for the timepiece component such as the hairspring 108*a* may be set arbitrarily depending on the specifications, the usage environment, the cost of manufacturing of the mechanical timepiece, for example. The hardness required for the timepiece component such as the hairspring 108*a* may be adjusted by not only the material of the intermediate films 51*a* to 51*d* but also the film thickness of the intermediate films 51*a* to 51*d*, for example.

For example, when a high hardness is required for the timepiece component such as the hairspring 108*a*, titanium (Ti) may be used that is a metal harder than copper (Cu) and gold (Au). On the other hand, for example, when flexibility and ductility are required for the clock component such as the hairspring 108*a*, copper (Cu) or gold (Au) having relatively soft characteristics can be used. Copper (Cu) and gold (Au) may exhibit ductility because of soft characteristics and may therefore deform following the deformation of the hairspring 108*a*, so that even when silicon is used for forming the hairspring 108*a*, the fragility (brittleness) of the hairspring 108*a* may be reduced.

The buffer films 21*a* to 21*d* are mainly composed of a second material. The second material may be achieved by a material having a tenacity higher than that of the first material. For example, if the first material is silicon, the second material may be achieved by a resin having a tenacity higher than that of silicon. Materials usable as the second material include, for example, an acrylic resin, an epoxy resin, and a para-xylylene-based polymer that is a polymer synthetic material.

Various improvements have been made in acrylic resins in recent years, resulting in the development of an acrylic resin called electrodeposition resist that may be formed in to a film having a constant thickness by an electrodeposition method and that may be patterned. By using such an electrodeposition resist made of an acrylic resin, the buffer films 21*a* to 21*d* having a constant (uniform) film thickness may be provided on a surface of a timepiece component having a precise and complicated shape such as the hairspring 108*a*.

The hairspring 108*a* required to extend and contract in a constant cycle becomes unbalanced and eccentric if the thickness of the buffer films 21*a* to 21*d* provided on the surface of the hairspring 108*a* is not uniform. By using the acrylic resin called electrodeposition resist, the buffer films 21*a* to 21*d* having a constant (uniform) film thickness may be provided, so that the hairspring 108*a* may operate correctly. As described above, the electrodeposition resist made of an acrylic resin is suitable for a material of timepiece components having a precise and complicated shape, or particularly, the buffer films 21*a* to 21*d* etc. used for the hairspring 108*a* extending and contracting for operation.

Additionally, in not only the hairspring 108*a* but also other timepiece components, if a portion with uneven thickness such as a so-called "buffer film gathering" exists on the surfaces of the buffer films 21*a* to 21*d* or the buffer films 21*a* to 21*d* differs in film thickness depending on a location, a trouble may occur such as rubbing against another structure at the time of movement and generating inconsistency in operation, for example. If the buffer films 21*a* to 21*d* protrude from the surfaces of the base materials 11*a* to 11*d*, the outer shape of the timepiece component may become different from designed dimensions. In such a case, the shape is not formed as designed, resulting in a timepiece component lacking a predetermined performance (a defective product).

In this regard, by using the acrylic resin called electrodeposition resist as the second material to form the buffer films 21*a* to 21*d* with the electrodeposition method, the buffer films 21*a* to 21*d* having a constant (uniform) film thickness can be formed on the surfaces of the base materials 11*a* to 11*d*, so that the trouble as described can be avoided. The buffer films 21*a* to 21*d* are formed to be 5 μm in thickness, for example.

When the buffer films 21*a* to 21*d* are formed with the electrodeposition method, the intermediate films 51*a* to 51*d* can be used as electrodes to which a voltage is applied during electrodeposition. In the electrodeposition of an object by the electrodeposition method, a material to be electrodeposited (e.g., an acrylic resin) is formed on an upper portion (surface) of an underlying electrode. Therefore, by providing the intermediate films 51*a* to 51*d* having shapes matched to the shapes of the buffer films 21*a* to 21*d* desired to be formed, the buffer films 21*a* to 21*d* reflecting the shapes of the underlying intermediate films 51*a* to 51*d* may easily be formed.

(Method of Manufacturing Hairspring 108*a*)

Figure 4:
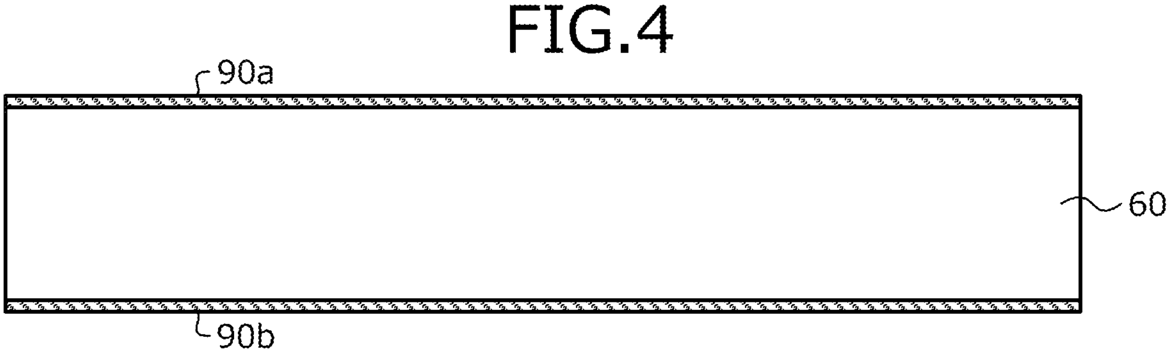
FIG. 4 is an explanatory view (part 1) of a method of manufacturing the hairspring of the first embodiment according to the present invention.
Figure 5:
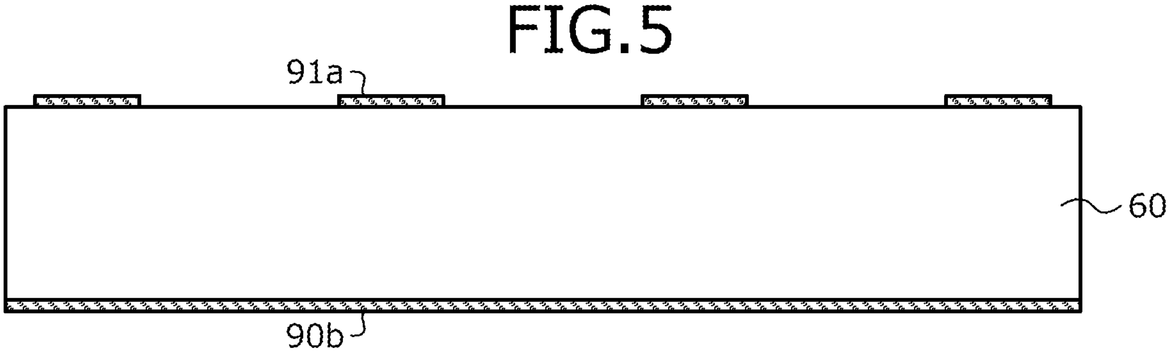
FIG. 5 is an explanatory view (part 2) of the method of manufacturing the hairspring of the first embodiment according to the present invention.
Figure 6:
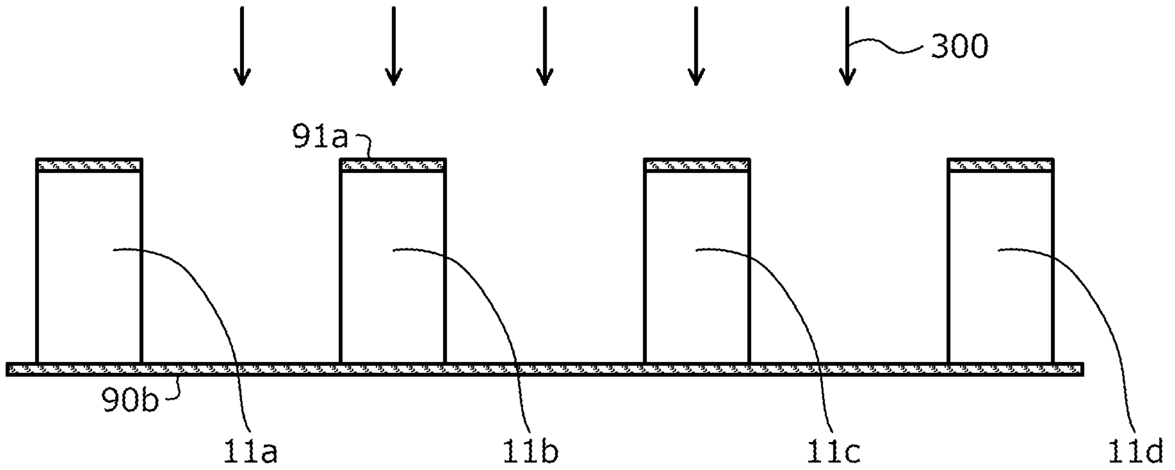
FIG. 6 is an explanatory view (part 3) of the method of manufacturing the hairspring of the first embodiment according to the present invention.
Figure 7:
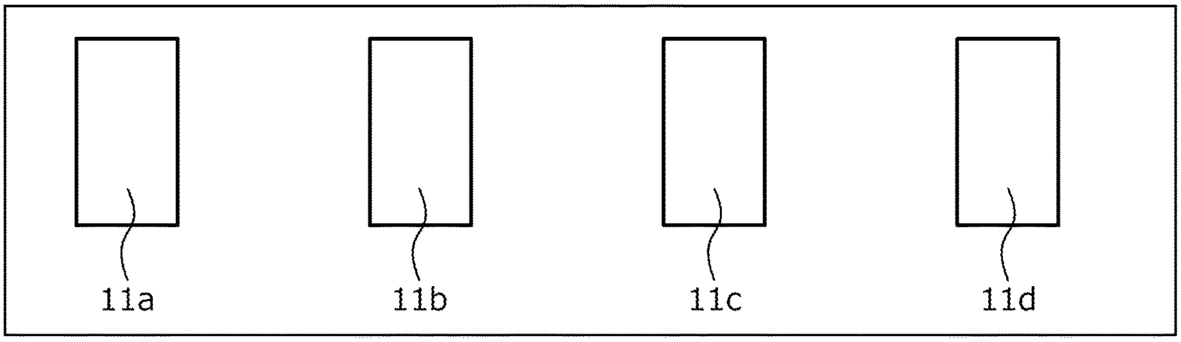
FIG. 7 is an explanatory view (part 4) of the method of manufacturing the hairspring of the first embodiment according to the present invention.
Figure 8:
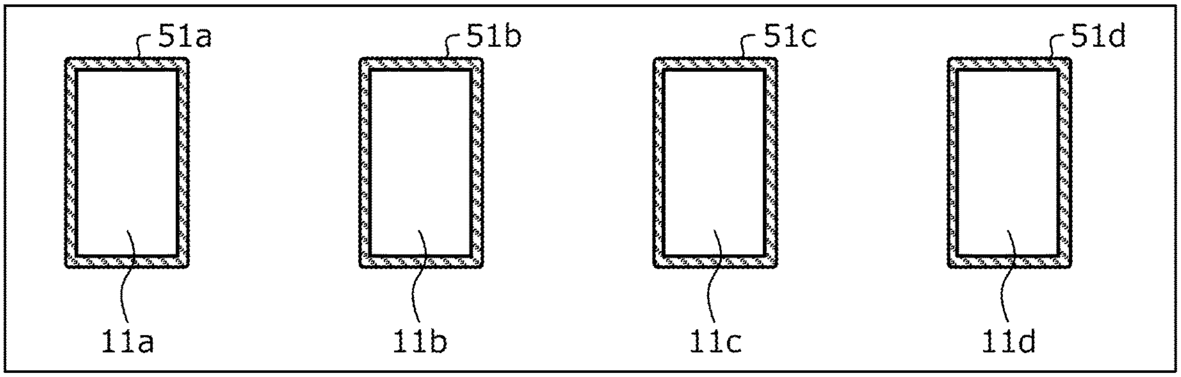
FIG. 8 is an explanatory view (part 5) of the method of manufacturing the hairspring of the first embodiment according to the present invention.
Figure 9:
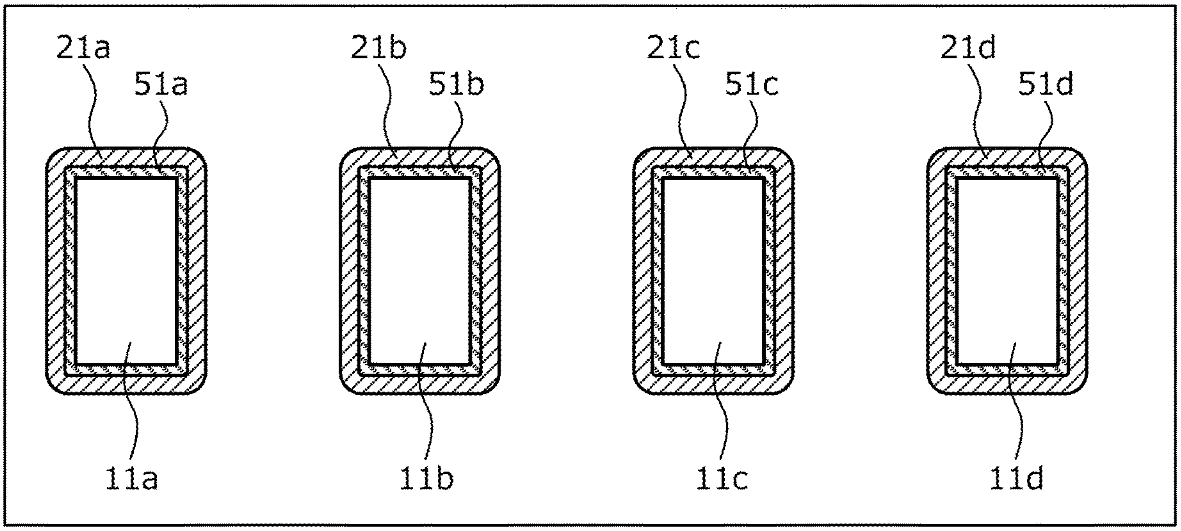
FIG. 9 is an explanatory view (part 6) of the method of manufacturing the hairspring of the first embodiment according to the present invention.

A method of manufacturing the hairspring 108*a* will be described as a method of manufacturing a timepiece component of the first embodiment according to the present invention. FIGS. 4, 5, 6, 7, 8, and 9 are explanatory views of the method of manufacturing the hairspring 108*a* of the first embodiment according to the present invention. FIGS. 4 to 6 depict steps of forming the base materials 11*a* to 11*d* in the hairspring 108*a*. FIGS. 7 to 9 depict steps of sequentially forming metal films and buffer films on the surfaces of the base materials 11*a* to 11*d*. FIGS. 4 to 9 depict the positions corresponding to FIG. 3 described above.

For manufacturing the hairspring 108*a*, first, a silicon substrate 60 is prepared. The silicon substrate 60 has an area and a thickness sized such that at least the hairspring 108*a* may be taken out. Considering the productivity of the hairspring, the silicon substrate 60 is preferably sized such that a number of the hairsprings 108*a* can be taken out.

Subsequently, as depicted in FIG. 4, a mask layer 90*a* is formed on a front surface of the silicon substrate 60, and a mask layer 90*b* is formed as a film on a back surface of the silicon substrate 60. The mask layers 90*a*, 90*b* function as protective films in processing using the Deep RIE technique performed at the subsequent step. The mask layers 90*a*, 90*b* are preferably formed of silicon oxide ($SiO_2$) having an etching rate slower than silicon. If silicon oxide is used, the mask layers 90*a*, 90*b* may be formed by using, for example, a known vapor phase growth technique or a film formation technique represented by a CVD method. The mask layers 90*a*, 90*b* may be formed by growing silicon oxide to a film thickness of 1 μm on the front surface of the silicon substrate 60, for example.

Subsequently, as depicted in FIG. 5, a mask layer 91*a* is formed on the front surface of the silicon substrate 60. The mask layer 91*a* may be formed by patterning the mask layer 90*a* into the shape of the hairspring 108*a*. The mask layer 91*a* may be patterned into the shape of the hairspring 108*a* by processing using a photolithography method widely known in general.

Subsequently, as depicted in FIG. 6, the silicon substrate 60 is processed into the shape of the hairspring 108*a*. The silicon substrate 60 may be processed by performing dry etching through the mask layer 91*a* with the Deep RIE technique using a mixed gas ($SF_6$+$C_4F_8$) 300 of $SF_6$ and $C_4F_8$, for example.

The silicon substrate 60 can be processed into a shape of an hairspring having a predetermined width by performing dry etching through the mask layer 91*a*. The silicon substrate 60 may be processed to a predetermined height (depth) by managing the processing time of the dry etching. By the dry etching through the mask layer 91*a* to the silicon substrate 60, the base materials 11*a* to 11*d* serving as the spring arms 201*a* to 201*d* are formed as denoted by reference characters 11*a* to 11*d* in FIG. 6.

Subsequently, as depicted in FIG. 7, the mask layer 90*b* and the mask layer 91*a* are removed from the processed silicon substrate 60 to expose the base materials 11*a* to 11*d* of the hairspring 108*a*. The mask layer 90*b* and the mask layer 91*a* may be removed, for example, by immersing the silicon substrate 60 dry-etched as described above in a known etchant mainly composed of hydrofluoric acid.

Subsequently, as depicted in FIG. 8, the intermediate films 51*a* to 51*d* are formed on the surfaces of the base materials 11*a* to 11*d*. The intermediate films 51*a* to 51*d* are formed on the entire surfaces of the base materials 11*a* to 11*d*, for example. As described above, for example, copper (Cu), gold (Au), nickel (Ni), etc. may be used as the material forming the intermediate films 51*a* to 51*d*.

The intermediate films 51*a* to 51*d* using copper (Cu), gold (Au), nickel (Ni), etc. are formed, for example, by using a sputtering method that is a kind of a vacuum film formation method to be 0.2 μm in thickness, for example. Alternatively, the intermediate films 51*a* to 51*d* may be achieved by natural oxide films (silicon oxide) formed on the surface of the silicon substrate 60 by exposing the silicon substrate 60 to the atmosphere, for example.

The intermediate films 51*a* to 51*d* serve as a foundation when the buffer films 21*a* to 21*d* are provided at the subsequent step. Additionally, the intermediate films 51*a* to 51*d* using copper (Cu), gold (Au), nickel (Ni), etc. act as electrodes when the buffer films 21*a* to 21*d* are formed by using an electrodeposition method described later. In the case of causing the buffer films 21*a* to 21*d* to act as electrodes, preferably, the intermediate films 51*a* to 51*d* are formed by using a material having a low electrical resistance.

Subsequently, as depicted in FIG. 9, the buffer films 21*a* to 21*d* are formed on the surfaces of the intermediate films 51*a* to 51*d*. As described above, the buffer films 21*a* to 21*d* are provided so as to mitigate external forces applied to the hairspring 108*a* and protect the base materials 11*a* to 11*d* made of a brittle material such as silicon from destruction. Therefore, a material having a tenacity higher than that of the first material constituting the base materials 11*a* to 11*d* is used for the second material constituting the buffer films 21*a* to 21*d*.

The second material forming the buffer films 21*a* to 21*d* may be selected depending on the hardness required for a timepiece component such as the hairspring 108*a* and the material forming the intermediate films 51*a* to 51*d*. In other words, the material forming the intermediate films 51*a* to 51*d* may be selected depending on the second material forming the buffer films 21*a* to 21*d*.

For example, when the intermediate films 51*a* to 51*d* are formed by using copper (Cu), the second material constituting the buffer films 21*a* to 21*d* may b be preferably achieved by using an acrylic resin or an epoxy resin. The buffer films 21*a* to 21*d* may be formed easily by using various known techniques such as a technique of spraying an acrylic resin or an epoxy resin (e.g., sputtering) or dropping a liquefied resin (e.g., spin coating) onto the silicon substrate 60 in a state of being rotated by a spin coating apparatus, for example, and a technique of immersing the substrate in a liquid tank containing a liquefied resin and then removing the substrate to form the films.

For example, in the case of forming the buffering films 21*a* to 21*d* by using a technique of dropping a liquefied resin for forming the films, first, a dispenser (not depicted) filled with a predetermined liquefied resin is prepared. Subsequently, for example, while a movable table (not depicted) with the hairspring 108*a* placed thereon is moved in a predetermined direction, the resin of the buffer films 21*a* to 21*d* is dropped from this dispenser. In this case, the resin is dropped so as not to protrude from the intermediate films 51*a* to 51*d* on the surfaces of the spring arms 201*a* to 201*d*.

Subsequently, a predetermined curing treatment is performed to cure the resin. The curing treatment curing the resin may be achieved by, for example, radiating ultraviolet light for a predetermined time in the case of using an ultraviolet curable resin. Alternatively, the curing treatment may be achieved by, for example, heating for a predetermined time in the case of using a thermosetting resin. As a result, the buffer films 21*a* to 21*d* may be formed on the surfaces of the intermediate films 51*a* to 51*d* formed on the surfaces of the spring arms 201*a* to 201*d*.

The buffer films 21*a* to 21*d* may also be formed by using an electrodeposition method. In the technique of dropping the resin for forming the buffer films 21*a* to 21*d*, the resin may not be formed uniformly in rare cases. In contrast, by using the electrodeposition method, the resin constituting the buffer films 21*a* to 21*d* may be formed into films having a constant thickness, and may be patterned easily, on the surfaces of the intermediate films 51*a* to 51*d*. When the buffer films 21*a* to 21*d* are formed by the electrodeposition method, an acrylic resin called electrodeposition resist is used. The electrodeposition method is a widely known film formation method in which a substance precipitated by electrolysis is attached for film formation onto the intermediate films 51*a* to 51*d* to which a voltage is applied.

For example, when the buffer films 21*a* to 21*d* are formed by using the electrodeposition method, the intermediate films 51*a* to 51*d* are formed in advance on a predetermined portion of the hairspring 108*a*. When the buffer films 21*a* to 21*d* are formed by using the electrodeposition method, preferably, the intermediate films 51*a* to 51*d* are formed by using copper (Cu) having a low electrical resistance, for example. A terminal region (not depicted) electrically connected to the intermediate films 51*a* to 51*d* is formed at the same time as the formation of the intermediate films 51*a* to 51*d*. This terminal region is provided in a portion not affecting the shape of the hairspring 108*a*.

Subsequently, the silicon substrate 60 with the intermediate films 51*a* to 51*d* and the terminal region formed is immersed in a state of being fixed by a known holding device into a liquid tank filled with an electrodeposition liquid containing the electrodeposition resist. In this case, a probe, etc. are preliminarily brought into contact with the terminal region electrically connected to the intermediate films 51*a* to 51*d*. The probe, etc. are connected to a predetermined power supply unit so that a predetermined voltage may be applied to the intermediate films 51*a* to 51*d*.

When a predetermined voltage is applied to the intermediate films 51*a* to 51*d* immersed in the electrodeposition liquid tank with the probe, etc. brought into contact with the terminal region, the electrodeposition resist precipitated by electrolysis in the liquid tank is attached to the surfaces of the intermediate films 51*a* to 51*d*. The voltage is applied until the electrodeposition resist reaches a predetermined film thickness. Although not particularly limited hereto, the electrodeposition resist is formed into a film having a thickness of 5 μm. The film thickness of the electrodeposition resist may be freely set in view of specifications, etc. of the mechanical timepiece. Therefore, when the buffer films 21*a* to 21*d* are formed by using the electrodeposition method, the film thickness of the electrodeposition resist may be adjusted easily by managing the time of application of the voltage.

Subsequently, the application of the voltage is terminated and the silicon substrate 60 is taken out from the liquid tank. As a result, the buffer films 21*a* to 21*d* reflecting the shapes of the intermediate films 51*a* to 51*d* may be formed on the surfaces of the intermediate films 51*a* to 51*d* to have a constant film thickness. By using the electrodeposition method, the buffer films 21*a* to 21*d* may be formed without significantly varying the shape of the hairspring 108*a* before and after forming the buffer films 21*a* to 21*d*.

For example, when the intermediate films 51*a* to 51*d* are achieved by natural oxide films (silicon oxide), the second material constituting the buffer films 21*a* to 21*d* may be preferably achieved by a resin material such as a para-xylylene-based polymer. The para-xylylene-based polymer is a polymer of an organic compound, para-xylylene, and can be formed into a thin film shape by causing a polymerization reaction on the surface of the hairspring 108*a*.

The para-xylylene-based polymer has a high conformal coatability. Therefore, by using the para-xylylene-based polymer, the buffer films 21*a* to 21*d* having a uniform film thickness without a pinhole may be formed even when a component has a fine complicated shape due to groove/hole/edge portions as in the case of a timepiece component such as the hairspring 108*a* used in a wristwatch, for example. The buffer films 21*a* to 21*d* made of the para-xylylene-based polymer may be formed by using a gas phase vapor deposition polymerization method that is a kind of chemical vapor deposition (CVD), for example.

With the manufacturing method as described above, the hairspring 108*a* with the buffer films 21*a* to 21*d* formed on the entire surface may be manufactured. In the hairspring 108*a* that is the timepiece component of the first embodiment, the base materials 11*a* to 11*d* are main members forming the shape of the timepiece component and are made of the first material (e.g., silicon) that is a nonconductive material, and the intermediate films 51*a* to 51*d* are included at least partially on the surfaces of the base materials 11*a* to 11*d*. The buffer films 21*a* to 21*d* made of the second material having a tenacity higher than that of the first material are provided on the surfaces of the intermediate films 51*a* to 51*d*.

As described above, the timepiece component of the first embodiment includes the base materials 11*a* to 11*d* formed by using silicon. Therefore, microfabrication may be performed with high accuracy by etching processing using the Deep RIE technique, so that a timepiece component forming a fine complicated shape may be manufactured with high precision and reduced variations in processing accuracy.

Moreover, the timepiece component of the first embodiment includes at least partially on the surfaces of the base materials 11*a* to 11*d* the intermediate films 51*a* to 51*d* formed by using a material having a tenacity higher than that of silicon forming the base materials 11*a* to 11*d*. Therefore, the timepiece component of the first embodiment may reduce the fragility of silicon to achieve a robust timepiece component even when silicon is used for forming the base materials 11*a* to 11*d*.

Furthermore, the timepiece component of the first embodiment includes the buffer films 21*a* to 21*d* having a high tenacity on the surfaces of the intermediate films 51*a* to 51*d*. Therefore, the timepiece component of the first embodiment has the buffer films 21*a* to 21*d* acting as a cushion and may mitigate the impact with the buffer films 21*a* to 21*d* even when the timepiece component comes into contact with another structure. Additionally, inclusion of the buffer films 21*a* to 21*d* enables the timepiece component of the first embodiment to prevent cracking and chipping due to stress concentration at a corner, etc. Therefore, the durability of the timepiece component may be improved.

As described above, the timepiece component of the first embodiment may reduce the fragility of silicon with the intermediate films 51*a* to 51*d* provided at least partially on the surfaces of the base materials 11*a* to 11*d* formed by using a silicon material and may mitigate external forces applied to the timepiece component by the buffer films 21*a* to 21*d* having a high tenacity provided on the surfaces of the intermediate films 51*a* to 51*d* so as to prevent cracking or chipping due to stress concentration at corners, etc.

According to the timepiece component of the first embodiment, since two different types of films are included as the intermediate films 51*a* to 51*d* and the buffer films 21*a* to 21*d*, a timepiece component may be achieved that is robust and resistant to breakage even when a contact with another structure or stress concentration occurs due to an impact.

According to the timepiece component of the first embodiment 1, the intermediate films 51*a* to 51*d* may be formed by using a material having a conductivity such as a metal material so as to use the intermediate films 51*a* to 51*d* as electrodes. In this case, the buffer films 21*a* to 21*d* may be formed by using the electrodeposition method, and the use of the electrodeposition method enables the formation of the buffer films 21*a* to 21*d* having a constant film thickness and a high coatability to the foundation (e.g., the intermediate films 51*a* to 51*d*).

According to the timepiece component of the first embodiment, even when a metal material is used, the metal material is used as a material forming the intermediate films 51*a* to 51*d* covering the surfaces of the base materials 11*a* to 11*d*. Therefore, the film thickness of the intermediate films 51*a* to 51*d* is extremely thin with respect to the thickness of the silicon. As a result, the timepiece component of the first embodiment does not adversely affect the excellent temperature characteristics of silicon.

Thus, even when the intermediate films 51*a* to 51*d* are formed by using a metal material having inferior temperature characteristics for the timepiece component as compared to the silicon forming the base materials 11*a* to 11*d*, the temperature characteristics of the first material such as silicon is not adversely affected unlike a metal plate formed by rolling, etc. of metal having a predetermined plate shape. As a result, the timepiece component of the first embodiment may exert the excellent temperature characteristics of silicon and may exhibit high strength.

As described above, according to the timepiece component of the first embodiment, the hairspring 108*a* highly accurate in terms of manufacturing may be reduced in weight by using the first material mainly composed of silicon, etc. for forming the base materials 11*a* to 11*d* and since the intermediate films 51*a* to 51*d* and the buffer films 21*a* to 21*d* are provided, the timepiece component is resistant to breakage and may exhibit high strength even when an external impact is applied.

Second Embodiment

A hairspring will be described as a timepiece component of a second embodiment according to the present invention manufactured by a manufacturing method of the second embodiment according to the present invention. In the second embodiment, portions identical to as those of the first embodiment described above are denoted by the same reference characters used in the first embodiment and will not be described. In the description of the second embodiment, the hairspring 108 will be denoted by reference character 108*b*.

Figure 10:
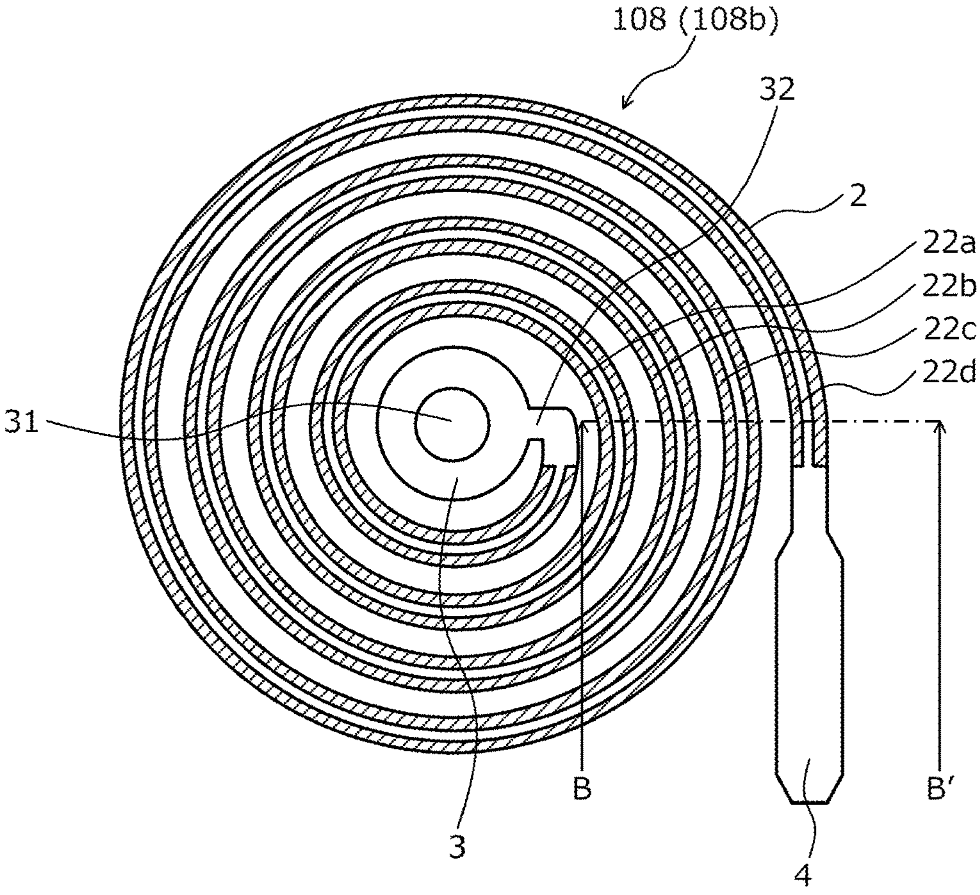
FIG. 10 is an explanatory view of a structure of the hairspring of a second embodiment according to the present invention.
Figure 11:
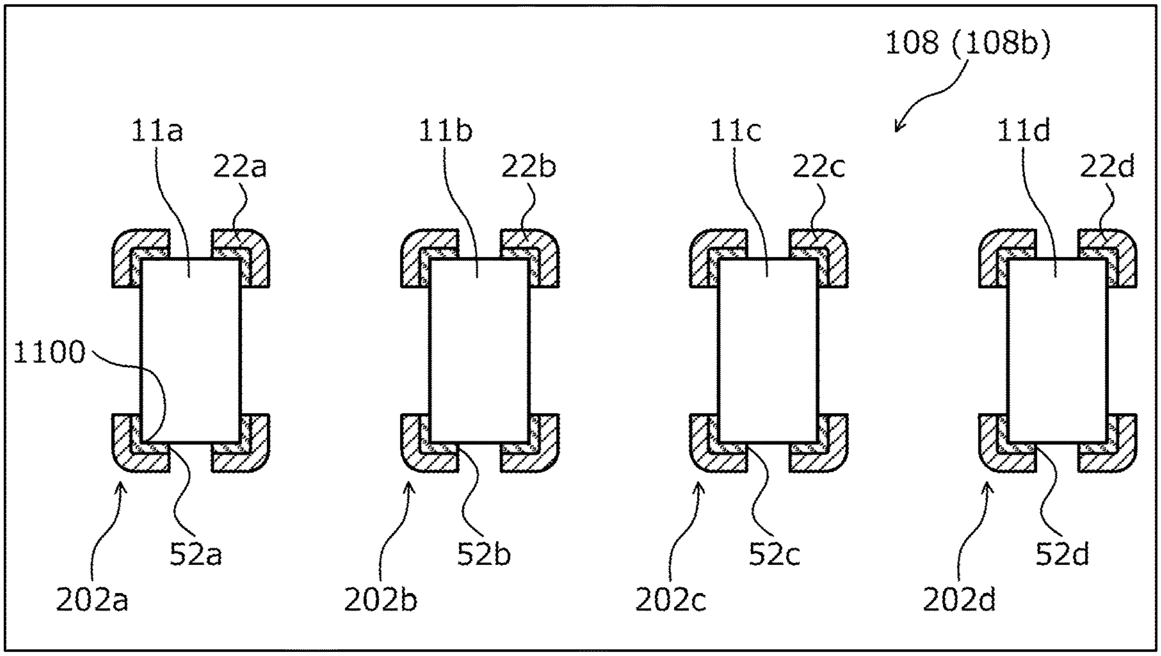
FIG. 11 is an explanatory view of a cross-section taken along B-B' in FIG. 10.

FIG. 10 is an explanatory view of the structure of the hairspring 108*b* of the second embodiment according to the present invention. FIG. 10 depicts a plane view of the hairspring 108*b* of the second embodiment in a direction of the arrow X of FIG. 1. FIG. 11 is an explanatory view of a cross-section taken along B-B' in FIG. 10. In FIGS. 10 and 11, the hairspring 108*b* of the second embodiment includes the spring unit 2 forming a single structure acquired by connecting spring arms 202*a*, 202*b*, 202*c*, 202*d* from an inner circumference.

The spring arms 202*a* to 202*d* may be, for example, 50 μm in width and 100 μm in height as is the case in the first embodiment. Both end portions of the spring unit 2 are formed by overlapping intermediate films 52*a*, 52*b*, 52*c*, 52*d* and buffer films 22*a*, 22*b*, 22*c*, 22*d* as is the case in the first embodiment. In the spring arms 202*a* to 202*d*, for example, the base materials 11*a* to 11*d* may be formed by using silicon as is the case in the first embodiment.

In the spring arms 202*a* to 202*d*, the intermediate films 52*a* to 52*d* are provided to cover four corners 1100 of the base materials 11*a* to 11*d* made of the first material. The intermediate films 52*a* to 52*d* can be formed by using the same material as the first embodiment in the same way as the manufacturing method of the first embodiment. For example, as is the case in the first embodiment, the film thickness of the intermediate films 52*a* to 52*d* can be 0.2 μm.

In the spring arms 202*a* to 202*d*, the buffer films 22*a* to 22*d* are provided as upper layers on the intermediate films 52*a* to 52*d*. The buffer films 22*a* to 22*d* are formed by using the second material as a main component. Although not particularly limited hereto, the film thickness of the buffer films 22*a* to 22*d* may be 5 μm, for example. The second material may be achieved by, for example, a resin or an electrodeposition resist as is the case in the first embodiment. If the electrodeposition resist is used as the second material, the buffer films 22*a* to 22*d* having a constant film thickness may be formed on the surfaces of the intermediate films 52*a* to 52*d* as is the case in the first embodiment.

The electrodeposition resist is the same as the photoresist and, therefore, by combining known photolithography and etching techniques, the buffer films 22*a* to 22*d* patterned in a predetermined shape may be formed only at the four corners 1100 of the base materials 11*a* to 11*d* in the spring arms 202*a* to 202*d*.

If some impact is applied to the hairspring 108*b*, the stress concentrates at the corners 1100. Therefore, when the hairspring 108*b* is formed by using a brittle material such as silicon, the corners 1100 may possibly chip or crack due to the effects of the impact. In this regard, as depicted in FIG. 11, the hairspring 108 of the second embodiment has the intermediate films 52*a* to 52*d* and the buffer films 22*a* to 22*d* with high tenacity provided at the corners 1100 of the hairspring 108*b* at which the stress concentrates, so that an impact applied to the corners 1100 may be mitigated. As a result, the robust hairspring 108*b* may be achieved.

(Method of Manufacturing Hairspring 108*b*)

Figure 12:
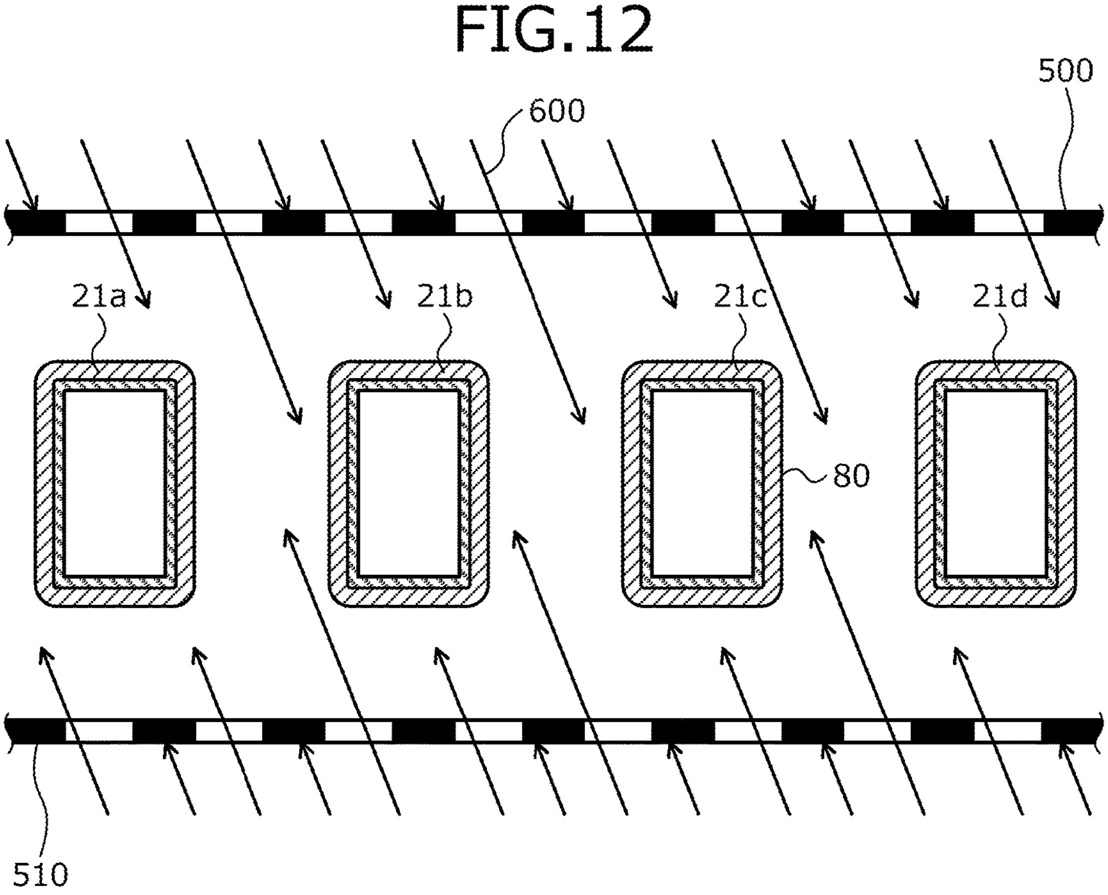
FIG. 12 is an explanatory view (part 1) of the method of manufacturing the hair spring of the second embodiment according to the present invention.
Figure 13:
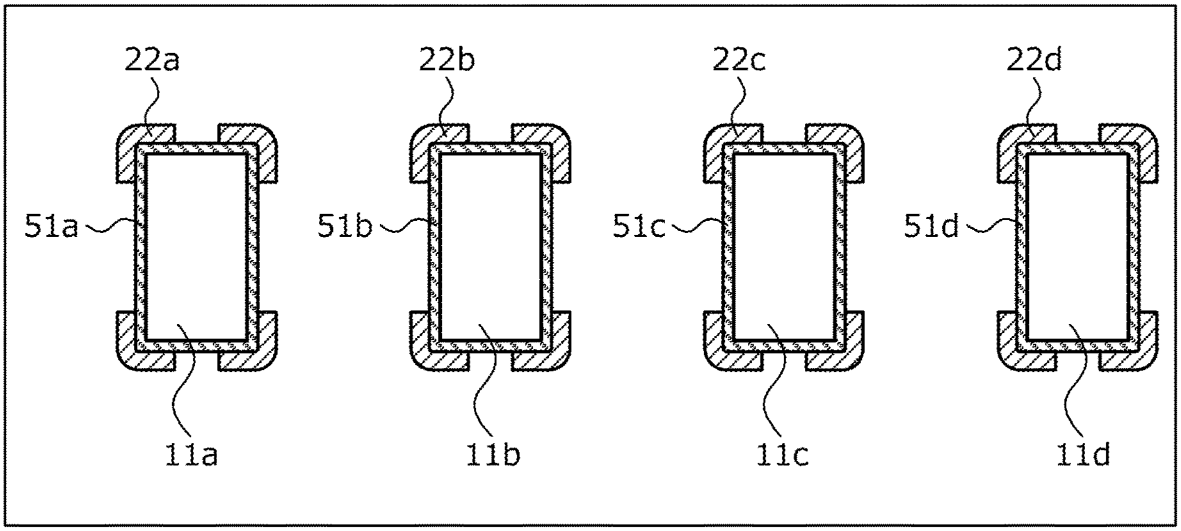
FIG. 13 is an explanatory view (part 2) of the method of manufacturing the hair spring of the second embodiment according to the present invention.

A method of manufacturing the hairspring 108*b* will be described as a method of manufacturing a timepiece component of the second embodiment according to the present invention. FIGS. 12 and 13 are explanatory views of the method of manufacturing the hair spring 108*b* of the second embodiment according to the present invention. For manufacturing the hairspring 108*b*, first, as is the case at the steps in FIGS. 4 to 9 in the first embodiment described above, the intermediate films 52*a* to 52*d* and the buffer films 22*a* to 22*d* are sequentially formed on the surfaces of the base materials 11*a* to 11*d*. The second embodiment will be described by taking, as an example, the buffer films 22*a* to 22*d* formed of the electrodeposition resist by using the electrodeposition method.

The buffer films 22*a* to 22*d* are patterned into a predetermined shape. As depicted in FIG. 12, the buffer films 22*a* to 22*d* are patterned by exposing the buffer films 21*a* to 21*d* made of the electrodeposition resist to an ultraviolet light 600 only in predetermined portions through exposure masks 500, 510.

The buffer films 22*a* to 22*d* of the second embodiment may be formed by using, for example, the electrodeposition resist made of a photosensitive material of a type in which an exposed portion is developed and dissolved. In this case, the exposure masks 500, 510 used are designed such that a portion to be left as a pattern is not exposed. For example, if it is desired to leave buffer films on the corners 1100 of the hairspring 108*b*, the exposure masks 500, 510 are shaped such that the ultraviolet light 600 is not applied to the corners 1100.

In patterning the buffer films 22*a* to 22*d*, as depicted in FIG. 12, the ultraviolet light 600 may be applied to a side surface 80 of the hairspring 108*b* by applying the ultraviolet light 600 in an oblique direction to the hairspring 108*b*. In patterning the buffer films 22*a* to 22*d*, for example, as depicted in FIG. 12, the light is applied at the exposure of 400 $mJ/cm^2$ by using an exposure device applying the ultraviolet light 600 in an oblique direction to the surfaces of the base materials 11*a* to 11*d*.

Subsequently, the exposed portions of the buffer films 21*a* to 21*d* made of the electrodeposition resist are removed as depicted in FIG. 13. By removing the exposed portions, the buffer films 22*a* to 22*d* patterned only on the corners 1100 of the hairspring 108*b* may be formed. The removal of the exposed portions may be achieved by dissolving the exposed portions by using a known developing solution. For example, the removal of the exposed portions is performed by, for example, developing the portions for 20 minutes by using electrolytic reduction ionized water at 25 degrees C. as the developing solution.

Subsequently, the intermediate films 51*a* to 51*d* are etched by using, as a mask, the buffer films 22*a* to 22*d* patterned only on the corners 1100 of the hairspring 108*b*. For example, if the intermediate films 51*a* to 51*d* are formed by using copper (Cu), the intermediate films 51*a* to 51*d* may be etched by using a cupric chloride-based etchant.

As a result, as depicted in FIG. 11, the portions of the intermediate films 51*a* to 51*d* not covered with the buffer films 22*a* to 22*d* are removed by etching, and the intermediate films 52*a* to 52*d* patterned in the same shape as the buffer films 22*a* to 22*d* are formed. When the portions of the intermediate films 51*a* to 51*d* not covered with the buffer films 22*a* to 22*d* are removed by etching, the base materials 11*a* to 11*d* are exposed in the portions corresponding to the portions removed by the etching. In this way, as depicted in FIG. 11, the hairspring 108*b* may be manufactured that includes the buffer films 22*a* to 22*d* formed on portions of the surfaces of the base materials 11*a* to 11*d*.

As described above, in the timepiece component of the second embodiment, by forming the buffer films 21*a* to 21*d* from the electrodeposition resist in advance, the buffer films 21*a* to 21*d* may be processed easily by combining well-known photolithography and etching techniques using a conventional photoresist. As a result, the buffer films 22*a* to 22*d* covering only the four corners 1100 of the base materials 11*a* to 11*d* may easily be formed.

In the manufacturing method of the second embodiment, the subsequent processing may be eliminated in the state depicted in FIG. 13. In this case, the intermediate films 51*a* to 51*d* remain covering the surfaces of the base materials 11*a* to 11*d*. By using such a configuration, the strength of the hairspring 108*b* may be increased. Whether to use the structure depicted in FIG. 11 or the structure depicted in FIG. 13 may be selected in view of the specifications and the usage environment of the mechanical timepiece on which the hairspring 108*b* is mounted, for example.

Third Embodiment

A hairspring will be described as a drive mechanism of a timepiece incorporating a timepiece component of a third embodiment according to the present invention manufactured by a manufacturing method according to the third embodiment according to the present invention. In the third embodiment, portions identical to those of the first and second embodiments described above are denoted by the same reference characters used in the first and second embodiments and will not be described. In the description of the third embodiment, the hairspring 108 will be denoted by reference character 108*c*.

Figure 14:
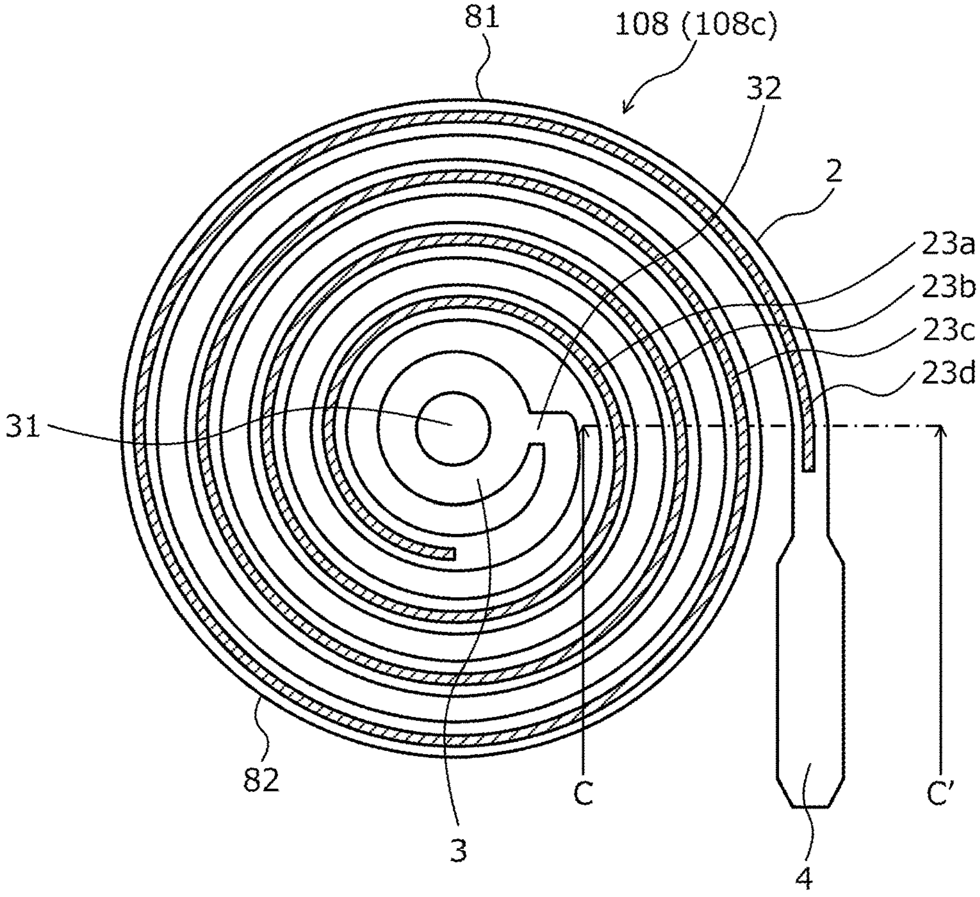
FIG. 14 is an explanatory view of a structure of the hairspring according to a third embodiment of the present invention.
Figure 15:
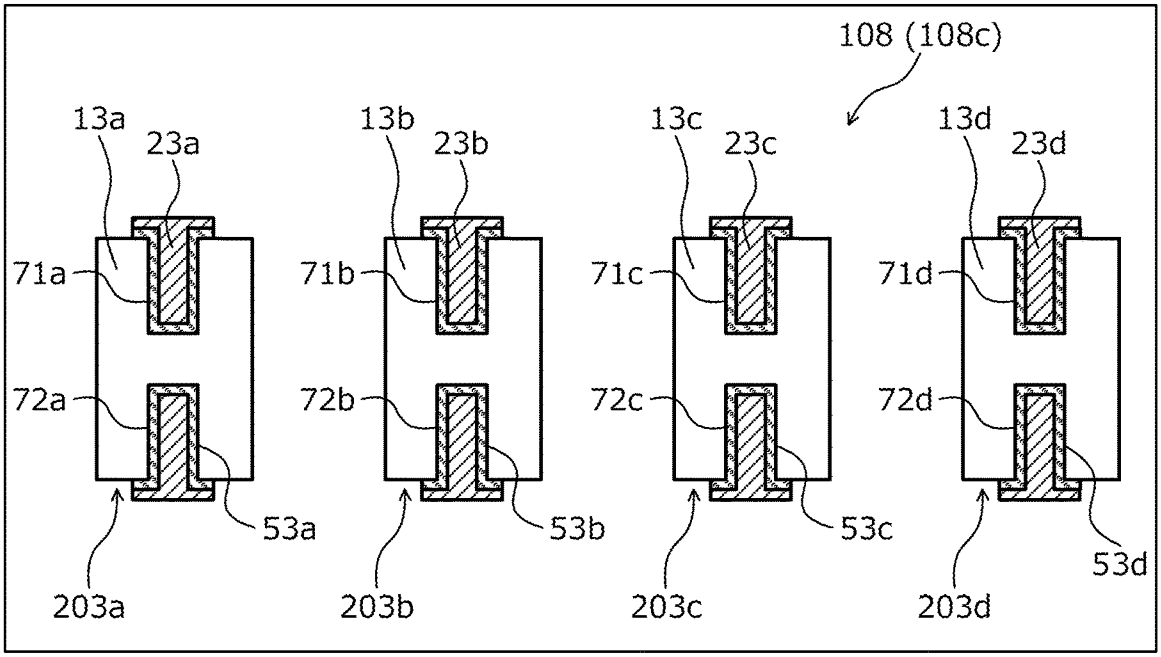
FIG. 15 is an explanatory view of a cross-section taken along C-C' in FIG. 14.

FIG. 14 is an explanatory view of the structure of the hairspring 108*c* according to the third embodiment of the present invention. FIG. 14 depicts a plane view of the hairspring 108*c* of the third embodiment in a direction of the arrow X of FIG. 1. FIG. 15 is an explanatory view of a cross-section taken along C-C' in FIG. 14. In FIGS. 14 and 15, the hairspring 108*c* of the third embodiment includes the spring unit 2 forming a single structure acquired by connecting spring arms 203*a*, 203*b*, 203*c*, 203*d* from an inner circumference. The spring arms 203*a* to 203*d* may be, for example, 50 μm in width and 100 μm in height as is the case in the first and second embodiments.

In the spring unit 2, end surfaces (flat surfaces) 81 on the front surface side of the base materials 11*a* to 11*d* are provided with groove portions 71*a*, 71*b*, 71*c*, 71*d* recessed in center portions in the width direction from the flat surfaces 81 toward end surfaces (flat surfaces) 82 on the back side of the base materials 11*a* to 11*d*. The groove portions 71*a* to 71*d* are recesses having a predetermined width and a predetermined depth. As a result, stepped portions are formed by the flat surfaces 81 and the groove portions 71*a* to 71*d* on the front surface side of the base materials 11*a* to 11*d*.

Additionally, in the spring unit 2, the flat surfaces 82 of the base materials 11*a* to 11*d* are provided with groove portions 72*a*, 72*b*, 72*c*, 72*d* recessed in center portions in the width direction from the flat surfaces 82 toward the flat surfaces 81. The groove portions 72*a* to 72*d* are recesses having a predetermined width and a predetermined depth. As a result, stepped portions are formed by the flat surfaces 82 and the groove portions 72*a* to 72*d* on the back surface side of the base materials 11*a* to 11*d*.

The groove portions 71*a* to 71*d* and the groove portions 72*a* to 72*d* are formed to have dimensions of 20 μm in width and 40 μm in depth. The dimensions of the groove portions 71*a* to 71*d* and the groove portions 72*a* to 72*d* are not particularly limited. Intermediate films 53*a*, 53*b*, 53*c*, 53*d* are provided on the inner sides (inner surfaces) of the groove portions 71*a* to 71*d* and the groove portions 72*a* to 72*d*.

As is the case in the first and second embodiments, the intermediate films 53*a* to 53*d* are formed by using a material having a tenacity higher than that of the first material forming the base materials 11*a* to 11*d*. The intermediate films 53*a* to 53*d* may be formed by using, for example, silicon oxide, alumina, DLC, a metal material, or an alloy acquired by mixing a metal material and other materials. As is the case in the first and second embodiments, the intermediate films 53*a* to 53*d* may be formed to be 0.2 μm in thickness, for example.

Buffer films 23*a* to 23*d* are provided on the surfaces of the intermediate films 53*a* to 53*d* as upper layers on the intermediate films 53*a* to 53*d*. The buffer films 23*a* to 23*d* are provided to fill the groove portions 71*a* to 71*d* and the groove portions 72*a* to 72*d*. The buffer films 23*a* to 23*d* are formed by using the second material having a tenacity higher than that of the first material, for example, as is the case in the first and second embodiments described above. For example, a resin, an electrodeposition resist, etc. may be used as the second material for the buffer films 23. By using the electrodeposition resist, the buffer films 23*a* to 23*d* having a constant film thickness (e.g., 5 μm) may be formed as the upper layers on the intermediate films 53*a* to 53*d*. In the third embodiment, the buffer films 23*a* to 23*d* are provided to fill the groove portions 71*a* to 71*d* and the groove portions 72*a* to 72*d* as depicted in FIG. 15.

Resin generally has a density lower than silicon. Therefore, by providing the groove portions 71*a* to 71*d* and the groove portions 72*a* to 72*d* in the base materials 11*a* to 11*d* formed of silicon and by filling the groove portions 71*a* to 71*d* and the groove portions 72*a* to 72*d* with the buffer films 23 formed of a resin as in the case of the hairspring 108*c*, the hairspring 108*c* may be reduced in weight by the volume of the groove portions 71*a* to 71*d* and the groove portions 72*a* to 72*d*.

Furthermore, by covering the inside of the groove portions 71*a* to 71*d* and the groove portions 72*a* to 72*d* with the intermediate films 53*a* to 53*d* formed by using a metal material, the hairspring 108*c* may be compensated for decreased strength due to provision of the groove portions 71*a* to 71*d* and the groove portions 72*a* to 72*d* (removal of volumes corresponding to the groove portions 71*a* to 71*d* and the groove portions 72*a* to 72*d* from the base materials 11*a* to 11*d*), and the strength of the hairspring 108*c* may be improved.

Moreover, by providing the buffer films 23 having a high tenacity as the upper layers on the intermediate films 53*a* to 53*d*, the hairspring 108*c* becomes resistant to destruction, and the durability of the hairspring 108*c* may be improved. Additionally, since the intermediate films 53*a* to 53*d* are provided to cover the corners of the groove portions 71*a* to 71*d* and the groove portions 72*a* to 72*d*, even when the hairspring 108*c* is subject to a strong impact, the corners may be prevented from being damaged due to stress concentration. As a result, the robust hairspring 108*c* may be manufactured.

By providing the buffer films 23 inside the groove portions 71*a* to 71*d* and the groove portions 72*a* to 72*d*, the resin may be provided inside the base materials 11*a* to 11*d* and as a result, the spring unit 2 may be given an elastic quality so that the spring unit 2 may be made resistant to breakage.

In the third embodiment described above, the groove portions 71*a* to 71*d* and the groove portions 72*a* to 72*d* are formed by making concave-shaped recesses in the flat surfaces 81, 82 so as to constitute the stepped portions; however, the stepped portions are not limited to those formed of a concave shape. For example, the flat surfaces 81, 82 may be projected in a convex shape in the direction opposite to the groove portions 71*a* to 71*d* and the groove portions 72*a* to 72*d* to constitute protrusions, and the intermediate films 53*a* to 53*d* and the buffer films 23 may be formed to cover the protrusions. As a result, the robust hairspring 108*c* may be manufactured.

In the description of the third embodiment, the hairspring 108*c* is provided with the groove portions 71*a* to 71*d* and the groove portions 72*a* to 72*d* in both the flat surface 81 and the flat surface 82; however, this is not a limitation. The groove portions 71*a* to 71*d* and the groove portions 72*a* to 72*d* may be provided in only one of the flat surface 81 and the flat surface 82.

(Method of Manufacturing Hairspring 108*c*)

A method of manufacturing the hairspring 108*c* will be described as a method of manufacturing the timepiece component of the third embodiment according to the present invention. FIGS. 16, 17, 18, 19, 20, 21, 22, 23, 14, 25, and 26 are explanatory views of the method of manufacturing the hairspring 108*c* of the third embodiment according to the present invention. In manufacturing the hairspring 108*c*, first, a silicon substrate 61 is prepared. The silicon substrate 61 has an area and a thickness sized such that at least the hairspring 108*c* may be taken out. Considering the productivity of the hairspring, the silicon substrate 61 may be preferably sized such that a number of the hairsprings 108*c* may be taken out.

Figure 16:
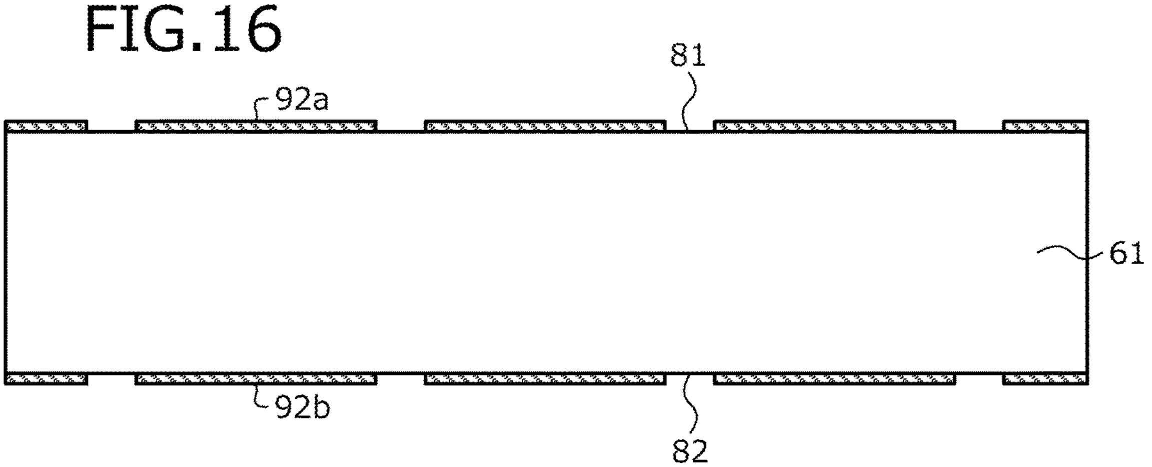
FIG. 16 is an explanatory view (part 1) of the method of manufacturing the hairspring of the third embodiment according to the present invention.

Subsequently, as depicted in FIG. 16, a mask layer 92*a* is formed on the front surface side of the flat surface 81 that is the end surface on the front side of the silicon substrate 61, and a mask layer 92*b* is formed on the back surface side of the flat surface 82 that is the end surface on the back side of the silicon substrate 61. The mask layers 92*a*, 92*b* have opening patterns formed for forming groove portions in predetermined portions of the hairspring.

The mask layers 92*a*, 92*b* function as protective films in processing using the Deep RIE technique performed at the subsequent step. The mask layers 92*a*, 92*b* may be preferably formed of silicon oxide ($SiO_2$) having an etching rate slower than silicon. The mask layers 92*a*, 92*b* may be formed by growing silicon oxide to a film thickness of 1 μm, for example.

Figure 17:
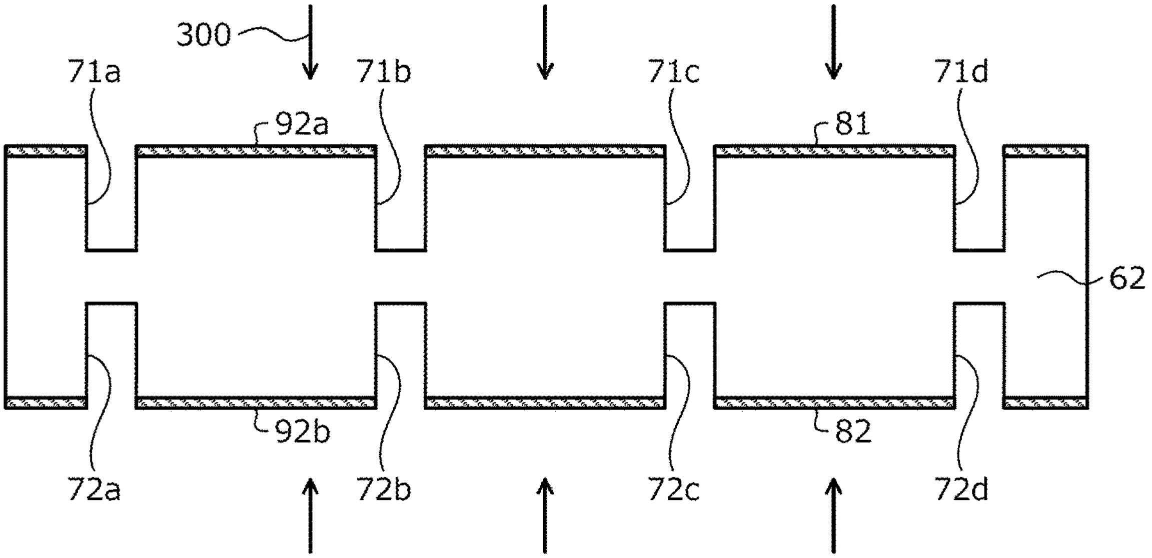
FIG. 17 is an explanatory view (part 2) of the method of manufacturing the hairspring of the third embodiment according to the present invention.

Subsequently, as depicted in FIG. 17, dry etching is performed through the mask layers 92*a*, 92*b* with the Deep RIE technique using the mixed gas ($SF_6$+$C_4F_8$) 300 of $SF_6$ and $C_4F_8$ while managing the processing time. As a result, the portions not covered with the mask layers 92a, 92b, i.e., the opening pattern portions opened in a predetermined shape, are subjected to the etching processing.

In other words, a silicon substrate 62 is formed that has the groove portions 71a to 71d formed on the flat surface 81 side and the groove portions 72a to 72d formed on the flat surface 82 side. Although not particularly limited hereto, the groove portions 71a to 71d and the groove portions 72a to 72d are formed to be 20 μm in width and 40 μm in depth, for example. When the silicon substrate 61 is dry-etched by the Deep RIE technique, the etching may be performed twice, separately on respective surfaces as the dry etching performed on the flat surface 81 side and the dry etching performed on the flat surface 82 side.

Figure 18:
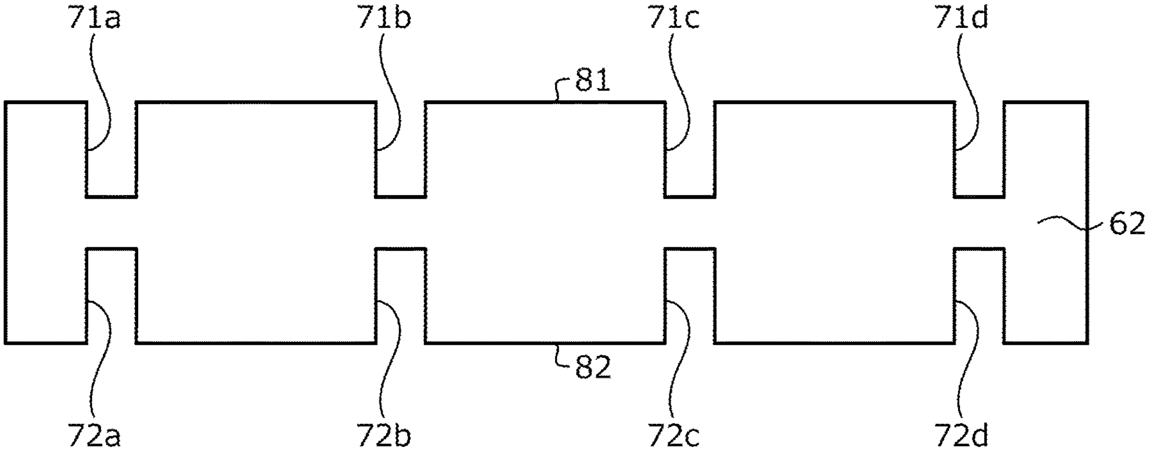
FIG. 18 is an explanatory view (part 3) of the method of manufacturing the hairspring of the third embodiment according to the present invention.

Subsequently, as depicted in FIG. 18, the mask layers 92a, 92b are removed from the silicon substrate 62. The mask layers 92a, 92b may be removed, for example, by immersing the silicon substrate 62 in a known etchant mainly composed of hydrofluoric acid. As a result, the mask layer 92a provided on the flat surface 81 side and the mask layer 92b provided on the flat surface 82 side may be removed simultaneously.

Figure 19:
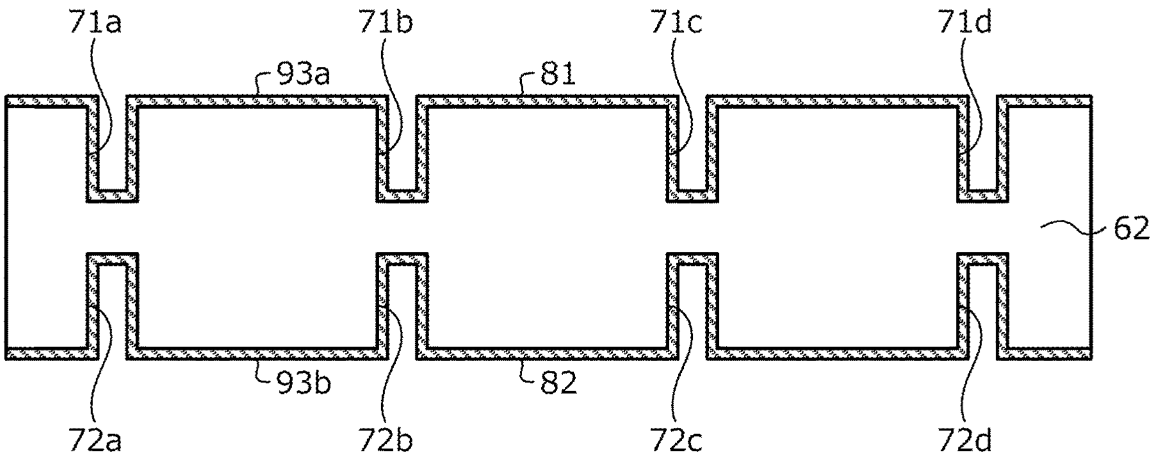
FIG. 19 is an explanatory view (part 4) of the method of manufacturing the hairspring of the third embodiment according to the present invention.

Subsequently, as depicted in FIG. 19, a mask layer 93a is formed on the flat surface 81 on the front surface side of the silicon substrate 62 and the inner walls of the groove portions 71a to 71d. Additionally, as depicted in FIG. 19, a mask layer 93b is formed on the flat surface 82 on the back surface side of the silicon substrate 62 and the inner walls of the groove portions 72a to 72d.

The mask layers 93a, 93b function as protective films in processing using the Deep RIE technique performed at the subsequent step. The mask layers 93a, 93b may be preferably formed of silicon oxide ($SiO_2$) having an etching rate slower than that of silicon. The mask layers 93a, 93b may be formed by growing silicon oxide to a film thickness of 1 μm, for example.

Figure 20:
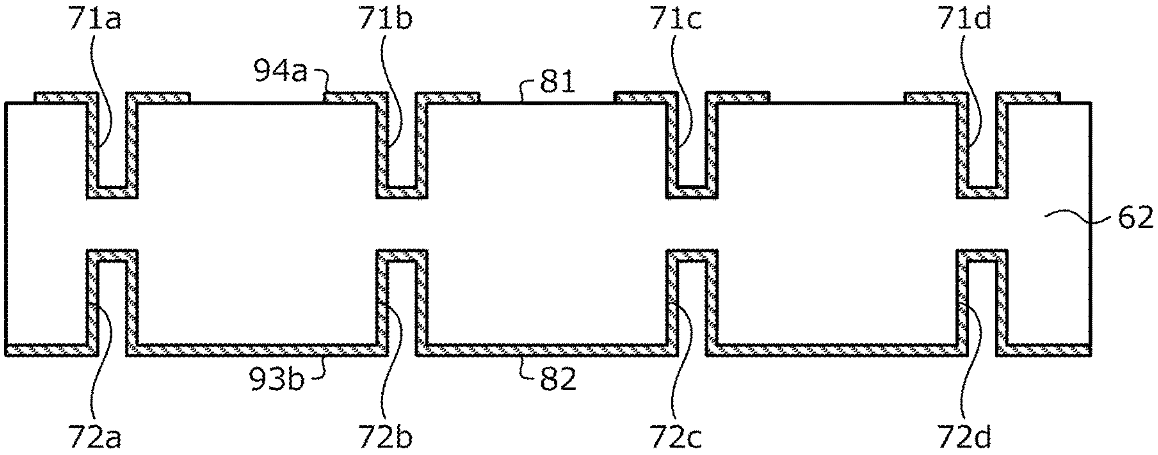
FIG. 20 is an explanatory view (part 5) of the method of manufacturing the hairspring of the third embodiment according to the present invention.

Subsequently, as depicted in FIG. 20, the mask layer 93a is processed to form a mask layer 94a patterned into the shape of the hairspring 108c. When the mask layer 93a is processed, the processing is performed by a photolithography method widely known in general. As a result, The mask layer 94a patterned into the shape of the hairspring 108c may be formed.

Figure 21:
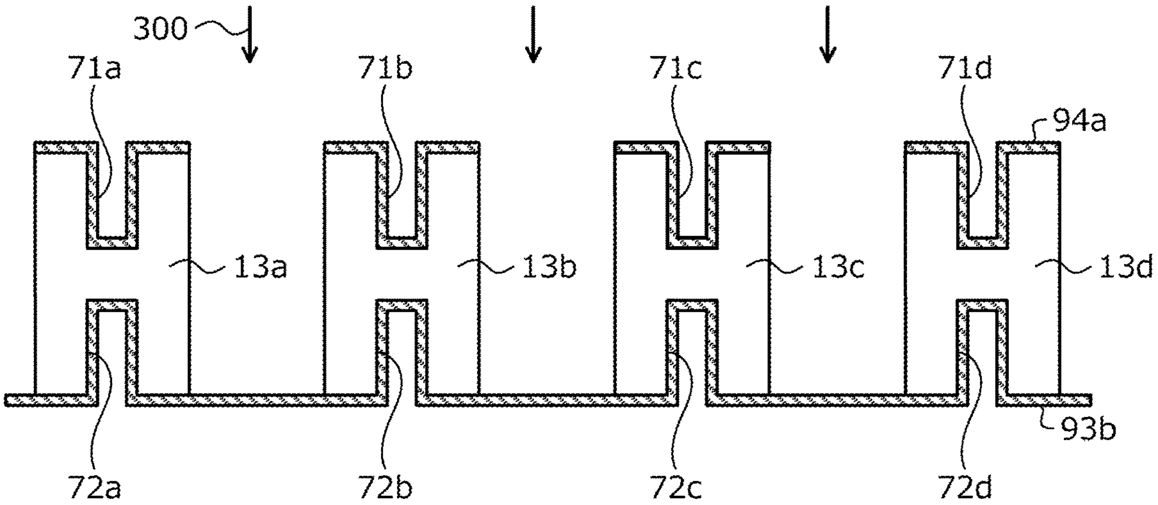
FIG. 21 is an explanatory view (part 6) of the method of manufacturing the hairspring of the third embodiment according to the present invention.

Subsequently, as depicted in FIG. 21, dry etching is performed through the mask layers 94a, 93b with the Deep RIE technique using the mixed gas ($SF_6$+$C_4F_8$) 300 of $SF_6$ and $C_4F_8$ while managing the processing time. As a result, the portions not covered with the mask layer 94a, i.e., the opening pattern portions opened in a predetermined shape, are subjected to the etching processing, and the silicon substrate 62 is processed into the shapes of base materials 13a to 13d having a predetermined width and a predetermined height.

Figure 22:
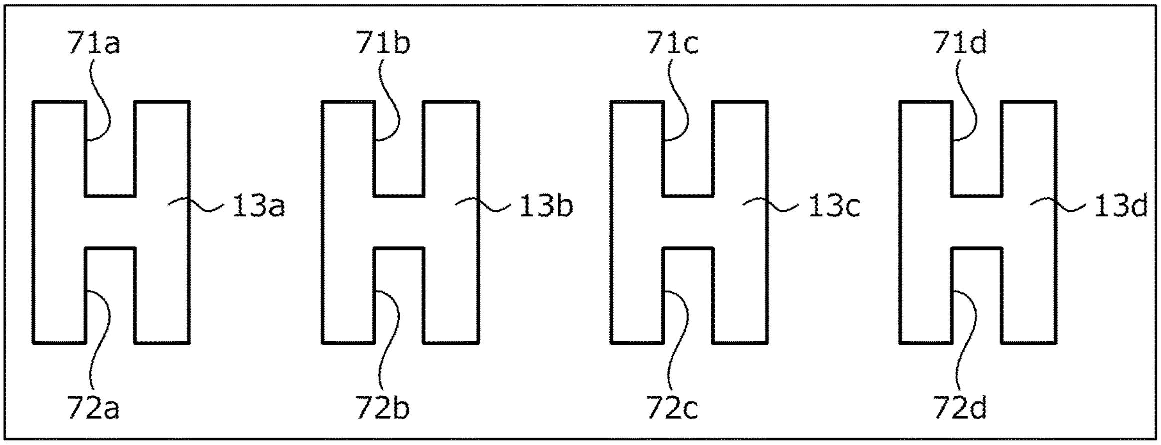
FIG. 22 is an explanatory view (part 7) of the method of manufacturing the hairspring of the third embodiment according to the present invention.

Subsequently, as depicted in FIG. 22, the mask layers 93b, 94a are removed. The mask layers 93b, 94a may be removed, for example, by immersing the silicon substrate 62 in a known etchant mainly composed of hydrofluoric acid. As a result, the base materials 13a to 13d of the hairspring 108c as depicted in FIG. 22 are exposed. The groove portions 71a to 71d and the groove portions 72a to 72d are respectively formed in the base materials 13a to 13d in the exposed state.

Figure 23:
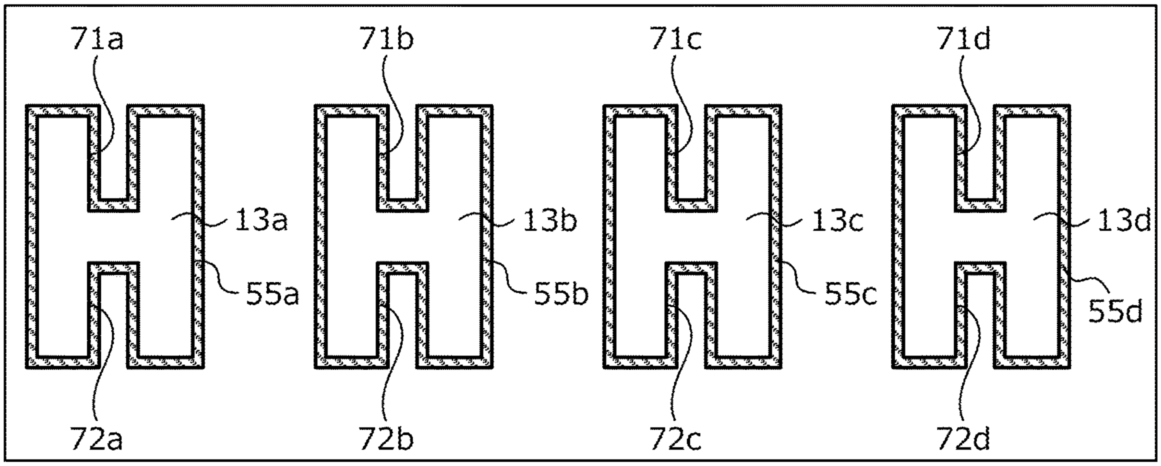
FIG. 23 is an explanatory view (part 8) of the method of manufacturing the hairspring of the third embodiment according to the present invention.

Subsequently, as depicted in FIG. 23, intermediate films 55a to 55d are formed to cover the surfaces of the base materials 13a to 13d. The intermediate films 55a to 55d are also provided inside the groove portions 71a to 71d and the groove portions 72a to 72d. The intermediate films 55a to 55d may be formed by using the various materials described above and may be formed by using copper (Cu), gold (Au), or nickel (Ni), for example. For example, if the intermediate films 53a to 53d are formed by using copper (Cu), the intermediate films 55a to 55d may be formed by a sputtering method that is a kind of a vacuum film formation method. The intermediate films 55a to 55d are formed to be 0.2 μm in thickness, for example.

Figure 24:
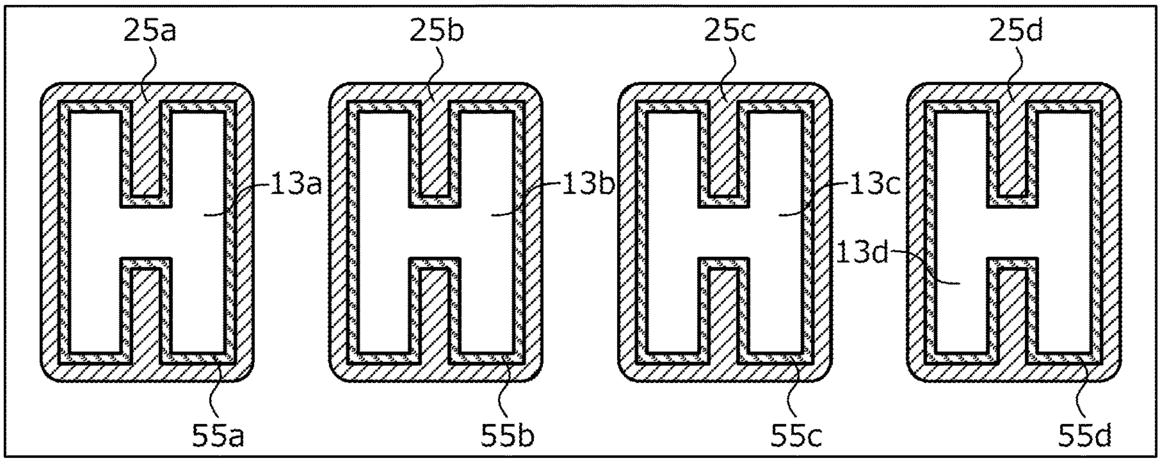
FIG. 24 is an explanatory view (part 9) of the method of manufacturing the hairspring of the third embodiment according to the present invention.

Subsequently, as depicted in FIG. 24, buffer films 25a to 25d are formed as upper layers on the intermediate films 55a to 55d. As described above, the buffer films 25a to 25d mitigate an impact externally applied to the hairspring 108c. Therefore, the buffer films 25a to 25d are formed by using a material having a tenacity higher than that of the first material constituting the base materials 13a to 13d so as to be suitable for mitigating the impact. In the third embodiment, since the buffer films 25a to 25d must be processed into a predetermined shape, a material not only suitable for mitigating the impact but also easy to process is selected.

For a material having a high tenacity and capable of being patterned (easy to process), for example, an electrodeposition resist made of an acrylic resin used in an electrodeposition method is preferable. Use of the electrodeposition resist made of an acrylic resin enables the buffer films 25a to 25d having a constant thickness to be formed and the buffer films 25a to 25d may be favorably patterned.

Use of such an electrodeposition resist made of an acrylic resin as the buffer films 25a to 25d, as depicted in FIG. 24, enables the buffer films 25a to 25d made of the electrodeposition resist to be formed easily as upper layers on the intermediate films 55a to 55d containing copper (Cu) formed on the base materials 13a to 13d containing silicon. Although not particularly limited hereto, the film thickness of the buffer films 25a to 25d may be formed to be 5 μm in thickness, for example.

Figure 25:
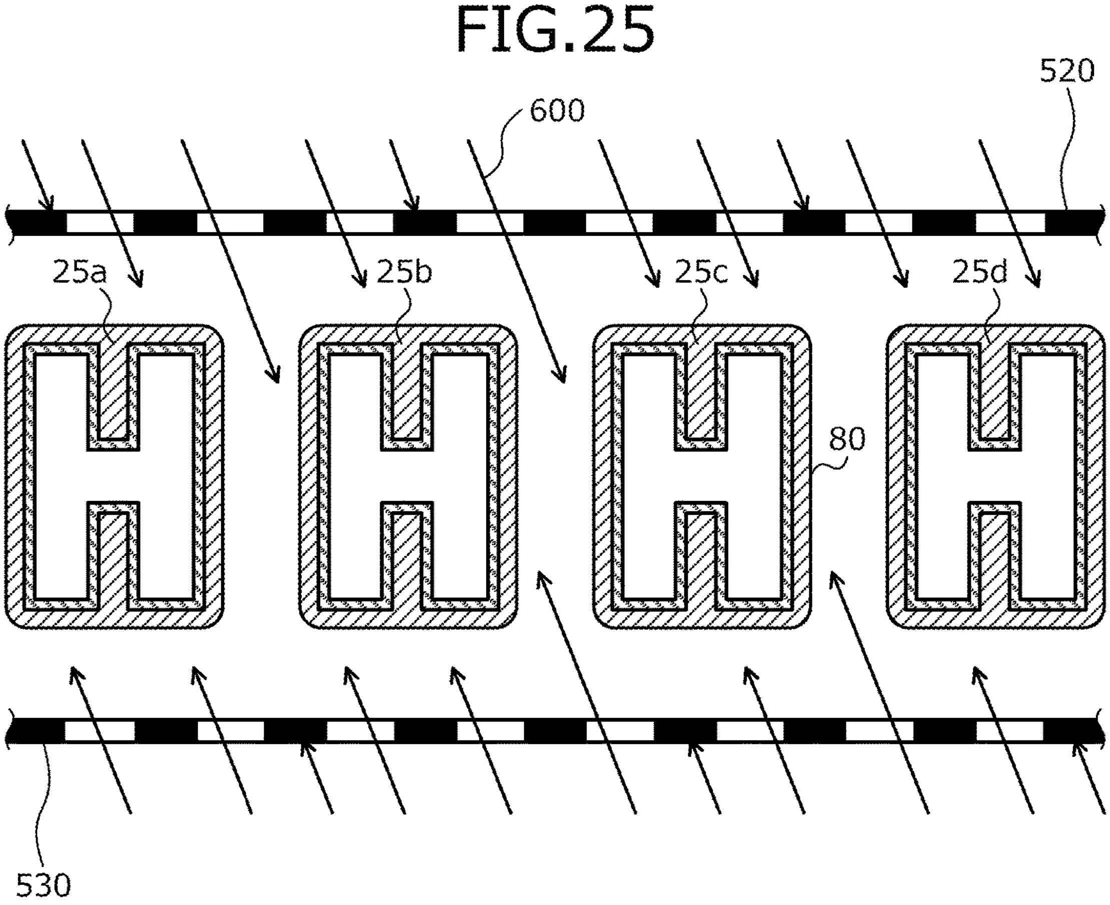
FIG. 25 is an explanatory view (part 10) of the method of manufacturing the hairspring of the third embodiment according to the present invention.

Subsequently, as depicted in FIG. 25, the buffer films 25a to 25d made of the electrodeposition resist are exposed to the ultraviolet light 600 only in predetermined portions through exposure masks 520, 530. For the electrodeposition resist used in the third embodiment, as described in the second embodiment 2, for example, the electrodeposition resist may be used that is made of a photosensitive material of a type in which an exposed portion is developed and dissolved. The exposure masks 520, 530 are designed such that the buffer films 25a to 25d in the groove portions 71a to 71d and the groove portions 72a to 72d are not exposed to the ultraviolet light 600.

For patterning the buffer films 25a to 25d, as depicted in FIG. 25, the ultraviolet light 600 may be applied to the side surface 80 of the hairspring 108c by applying the ultraviolet light 600 in an oblique direction to the hairspring 108c. For patterning the buffer films 25a to 25d, for example, as depicted in FIG. 25, the light is applied at the exposure of 400 $mJ/cm^2$ by using an exposure device applying the ultraviolet light 600 in an oblique direction to the surfaces of the base materials 13a to 13d.

Figure 26:
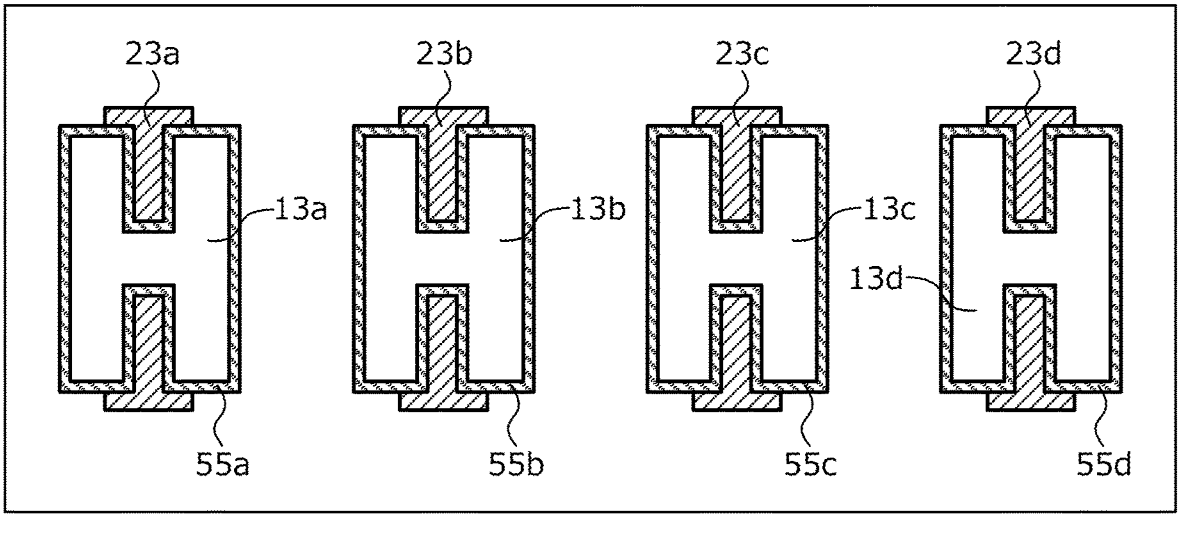
FIG. 26 is an explanatory view (part 11) of the method of manufacturing the hairspring of the third embodiment according to the present invention.

Subsequently, the exposed portions of the buffer films 25a to 25d made of the electrodeposition resist are removed as depicted in FIG. 26. By removing the exposed portions, the hairspring 108c may be formed that has the buffer films 23a to 23d remaining only near the groove portions 71a to 71d and the groove portions 72a to 72d. The removal of the exposed portions may be achieved by dissolving the exposed portions by using a known developing solution. For example, the removal of the exposed portions is performed by developing the portions for 20 minutes by using electrolytic reduction ionized water at 25 degrees C. as the developing solution as is the case in the second embodiment as described above, for example.

Subsequently, the intermediate films 55*a* to 55*d* are etched by using, as a mask, the buffer films 23*a* to 23*d* formed in the groove portions 71*a* to 71*d* and the groove portions 72*a* to 72*d* of the hairspring 108*c*. For example, if the intermediate films 55*a* to 55*d* are formed by using copper (Cu), the intermediate films 55*a* to 55*d* may be etched by using a cupric chloride-based etchant.

As a result, as depicted in FIG. 15, the portions of the intermediate films 53*a* to 53*d* not covered with the buffer films 23*a* to 23*d* are removed by etching, and the intermediate films 53*a* to 53*d* remain in the state of being formed in the portions covered with the buffer films 23*a* to 23*d*. When the portions of the intermediate films 53*a* to 53*d* not covered with the buffer films 23*a* to 23*d* are removed by etching, the base materials 13*a* to 13*d* are exposed in the portions corresponding to the portions removed by the etching. In this way, as depicted in FIG. 15, the hairspring 108*c* may be manufactured that includes the buffer films 23*a* to 23*d* formed on portions of the surfaces of the base materials 13*a* to 13*d*.

In the manufacturing method of the third embodiment, the subsequent processing may be eliminated in the state depicted in FIG. 26. In this case, the intermediate films 53*a* to 53*d* remain covering the surfaces of the base materials 13*a* to 13*d*. By using such a constitution, the strength of the hairspring 108*c* may be increased. Whether to use the structure depicted in FIG. 15 or the structure depicted in FIG. 26 may be selected in view of the specifications and the usage environment of the mechanical timepiece on which the hairspring 108*c* is mounted, for example.

As depicted in FIGS. 14 and 15, the hairspring having the groove portions 71*a* to 71*d* and the groove portions 72*a* to 72*d* may be manufactured easily by the third manufacturing method as described above. Although the buffer films 23*a* to 23*d* are filled inside the groove portions 71*a* to 71*d* and the groove portions 72*a* to 72*d* in the example described in the third embodiment, this is not a limitation. In formation of the buffer films 23*a* to 23*d* by the electrodeposition method, the buffer films 23*a* to 23*d* may be formed with a constant film thickness on the upper portions of the intermediate films 53*a* to 53*d* by managing the formation time, etc.

Although the third manufacturing method described above has been described as the manufacturing method in which the buffer films 23*a* to 23*d* are formed in the groove portions 71*a* to 71*d* and the groove portions 72*a* to 72*d* having the concave shape as the stepped portions, even stepped portions having a convex shape (not depicted) may be manufactured by the same manufacturing method. In particular, when the stepped portions are formed, a mask may be patterned to form protrusions on the flat surfaces 81, 82. Portions to be masked and portions to be etched in this case will not be described in detail since this is widely used in the processing of semiconductor devices.

Fourth Embodiment (Method of Manufacturing Hairspring)

A method of manufacturing a hairspring of a fourth embodiment according to the present invention will be described as a method of manufacturing a timepiece component of the fourth embodiment according to the present invention. In the fourth embodiment, portions identical to those of the first to third embodiments described above are denoted by the same reference characters used in the first to third embodiments and will not be described. In the fourth embodiment, a method of manufacturing the hairspring 108 (108*d*) will be described.

FIGS. 27, 28, 29, and 30 are explanatory views of the method of manufacturing the hairspring 108*d* of the fourth embodiment according to the present invention. In manufacturing the hairspring 108*d*, first, the silicon substrate 61 is prepared. The silicon substrate 61 has an area and a thickness sized such that at least the hairspring 108*d* may be taken out. Considering the productivity of the hairspring, the silicon substrate 61 is preferably sized such that a number of the hairsprings 108*d* may be taken out.

Figure 27:
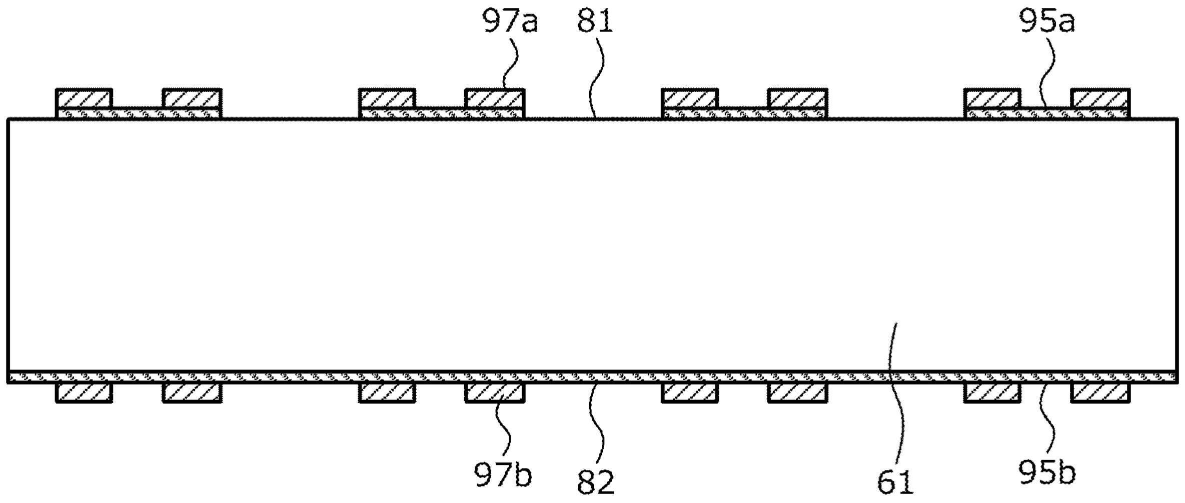
FIG. 27 is an explanatory view (part 1) of the method of manufacturing the hairspring of a fourth embodiment according to the present invention.

Subsequently, as depicted in FIG. 27, a first mask layer 95*a* is formed on the front surface side of the flat surface 81 of the silicon substrate 61, and a mask layer 95*b* is formed on the back surface side of the flat surface 82 of the silicon substrate 61. The mask layers 95*a*, 95*b* have opening patterns formed in predetermined portions corresponding to the shape of the hairspring 108*d* such that the silicon substrate 61 forms each of the base materials 13*a* to 13*d*.

As depicted in FIG. 27, a second mask layer 97*a* having an opening pattern formed for forming the groove portions 71*a* to 71*d* in predetermined portions of the hairspring 108*d* is formed as an upper layer on the first mask layer 95*a*, and a second mask layer 97*b* having an opening pattern formed for forming the groove portions 72*a* to 72*d* in predetermined portions of the hairspring 108*d* is formed as an upper layer on the first mask layer 95*b*. In the second mask layers 97*a*, 97*b*, opening patterns corresponding to the shape of the hairspring 108*d* are formed at positions corresponding to the opening patterns of the mask layers 95*a*, 95*b*.

The first mask layers 95*a*, 95*b* function as protective films in processing using the Deep RIE technique performed at the subsequent step. The first mask layers 95*a*, 95*b* are preferably formed of silicon oxide ($SiO_2$) having an etching rate slower than silicon. The first mask layers 95*a*, 95*b* may be formed by growing silicon oxide to a film thickness of 1 μm, for example.

The second mask layers 97*a*, 97*b* function as protective films when a groove shape is patterned on the first mask layers 95*a*, 95*b* at the subsequent step. The second mask layers 97*a*, 97*b* are preferably formed of a material having a corrosion resistance with respect to etching of the first mask layers 95*a*, 95*b*. For example, if the first mask layers 95*a*, 95*b* are formed by using silicon oxide, the second mask layers 97*a*, 97*b* may be formed by growing a photosensitive resist to a film thickness of 1 μm.

Figure 28:
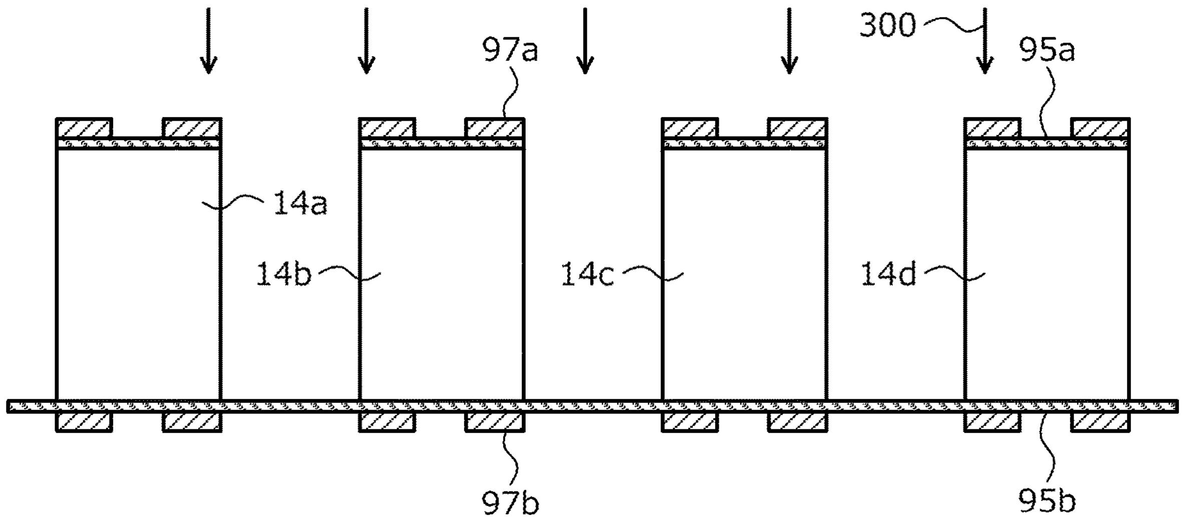
FIG. 28 is an explanatory view (part 2) of the method of manufacturing the hairspring of the fourth embodiment according to the present invention.

Subsequently, as depicted in FIG. 28, dry etching is performed through the first mask layers 95*a*, 95*b* with the Deep RIE technique using the mixed gas ($SF_6$+$C_4F_8$) 300 of $SF_6$ and $C_4F_8$ while managing the processing time. As a result, the portions not covered with the first mask layers 95*a*, 95*b*, i.e., the predetermined portions corresponding to the shape of the hairspring 108*d*, are processed so that base materials 14*a* to 14*d* having a predetermined width and a predetermined height are formed.

Figure 29:
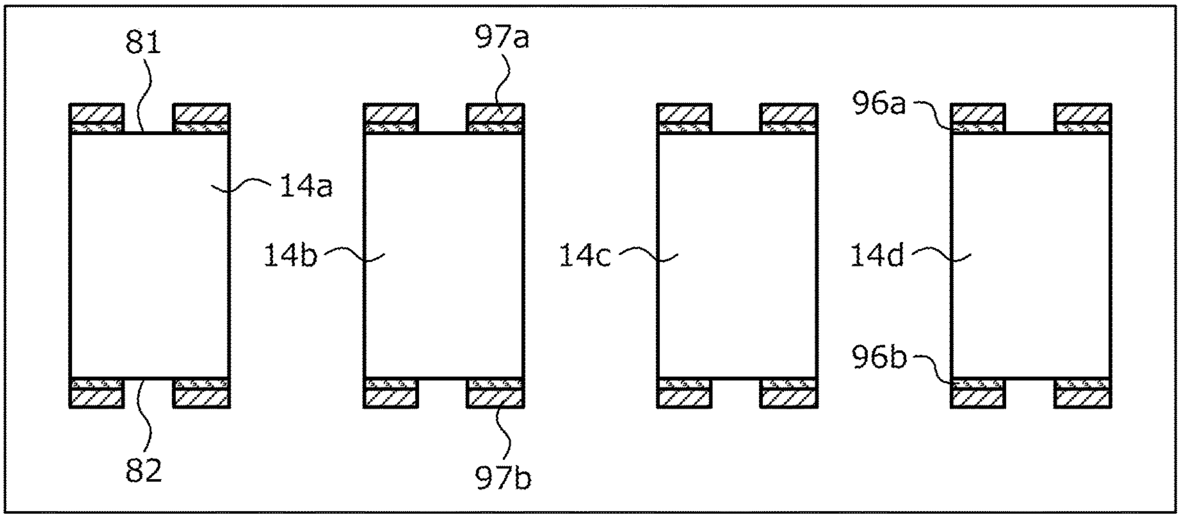
FIG. 29 is an explanatory view (part 3) of the method of manufacturing the hairspring of the fourth embodiment according to the present invention.

Subsequently, as depicted in FIG. 29, the first mask layers 95*a*, 95*b* are patterned by using the second mask layers 97*a*, 97*b* as masks. The first mask layers 95*a*, 95*b* are made of silicon oxide ($SiO_2$) as described above and therefore, in this patterning, the masks may be removed by immersing the silicon substrate 61 having the second mask layers 97*a*, 97*b* formed thereon in a known etchant mainly composed of hydrofluoric acid.

As a result, as depicted in FIG. 29, the first mask layers 95*a*, 95*b* in the portions serving as the groove portions 71*a* to 71*d* and the groove portions 72*a* to 72*b* are removed, and the processed first mask layers 96*a*, 96*b* are formed, overlapping with the second mask layers 97*a*, 97*b* in a planar manner. On the flat surface 81 side, the mask on the portions serving as the groove portions 71*a* to 71*d* is opened so that the silicon base materials 14*a*, 14*b*, 14*c*, 14*d* are exposed. The first mask layer 95*b* on the flat surface 82 side is also removed in a predetermined portion corresponding to the shape of the hairspring 108*c*. If the second mask layers 97*a*, 97*b* are photosensitive resists, the second mask layers 97*a*, 97*b* are not affected even when being immersed in the known etchant mainly composed of hydrofluoric acid.

Figure 30:
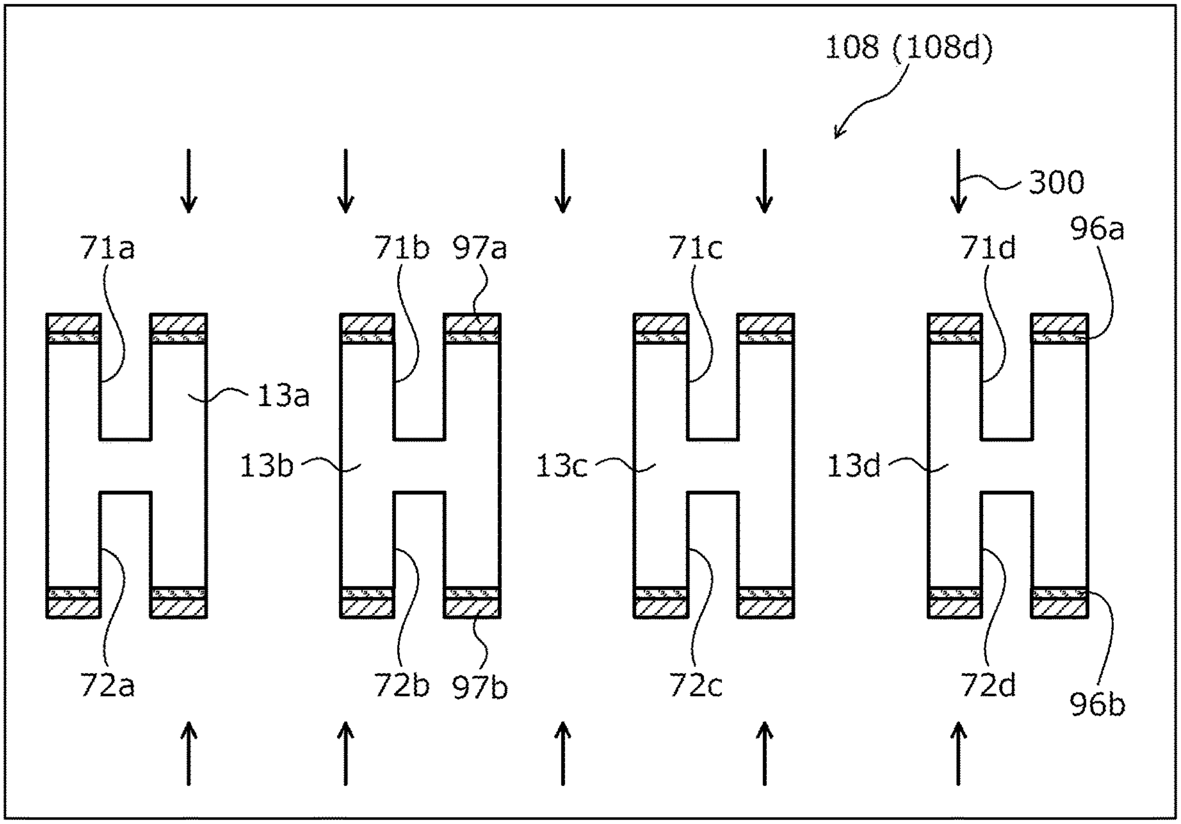
FIG. 30 is an explanatory view (part 4) of the method of manufacturing the hairspring of the fourth embodiment according to the present invention.

Subsequently, as depicted in FIG. 30, dry etching is performed through the second mask layers 97*a*, 97*b* and the processed first mask layers 96*a*, 96*b* with the Deep RIE technique using the mixed gas ($SF_6$+$C_4F_8$) 300 of $SF_6$ and $C_4F_8$ while managing the processing time. As a result, the portions not covered with the second mask layers 97*a*, 97*b* and the processed first mask layers 96*a*, 96*b*, i.e., the portions corresponding to the groove portions 71*a* to 71*d* and the groove portions 72*a* to 72*b*, are subjected to etching processing so that the silicon substrate 62 is processed into the shape of the base materials 13*a* to 13*d* having a predetermined width and a predetermined height.

Subsequently, the second mask layers 97*a*, 97*b* and the processed first mask layers 96*a*, 96*b* are removed. As a result, the base materials 13*a* to 13*d* of the hairspring 108*d* as depicted in FIG. 22 described above are formed. The groove portions 71*a* to 71*d* and the groove portions 72*a* to 72*b* are respectively formed on the front surface (the flat surface 81) and the back surface (the flat surface 82) of the base materials 13*a* to 13*d*.

The processed mask layers 96*a*, 96*b* may be removed, for example, by immersing the silicon substrate 62 in a known etchant mainly composed of hydrofluoric acid. The second mask layers 97*a*, 97*b* may be removed, for example, by immersing the silicon substrate 62 in a liquid of an organic solvent such as acetone. Subsequently, the hairspring 108*d* depicted in FIGS. 14 and 15 can be formed in the same way as FIGS. 23 to 26.

As described above, the manufacturing method according to the fourth embodiment is a method of manufacturing the hairspring 108*d* provided with the groove portions 71*a* to 71*d* and the groove portions 72*a* to 72*d* that are stepped portions in the spring arms 203*a* to 203*d* and provided with the intermediate films 53*a* to 53*d* and the buffer films 23*a* to 23*d* in the groove portions 71*a* to 71*d* and the groove portions 72*a* to 72*d* as is the case in the third embodiment described above, and the groove portions serving as the stepped portions may be formed after the step of forming the outer shape. Although the manufacturing method of the fourth embodiment is described as the manufacturing method in which the intermediate films 53*a* to 53*d* and the buffer films 23*a* to 23*d* are formed in the groove portions 71*a* to 71*d* and the groove portions 72*a* to 72*d* having a concave shape, convex-shaped steps may also be manufactured by the same manufacturing method as is the case in the third embodiment.

Fifth Embodiment

An anchor 107 will be described as a drive mechanism of a timepiece incorporating a timepiece component of a fifth embodiment according to the present invention manufactured by a manufacturing method according to the fifth embodiment according to the present invention. In the fifth embodiment, portions identical to those of the first to fourth embodiments described above are denoted by the same reference characters used in the first to fourth embodiments and will not be described.

Figure 31:
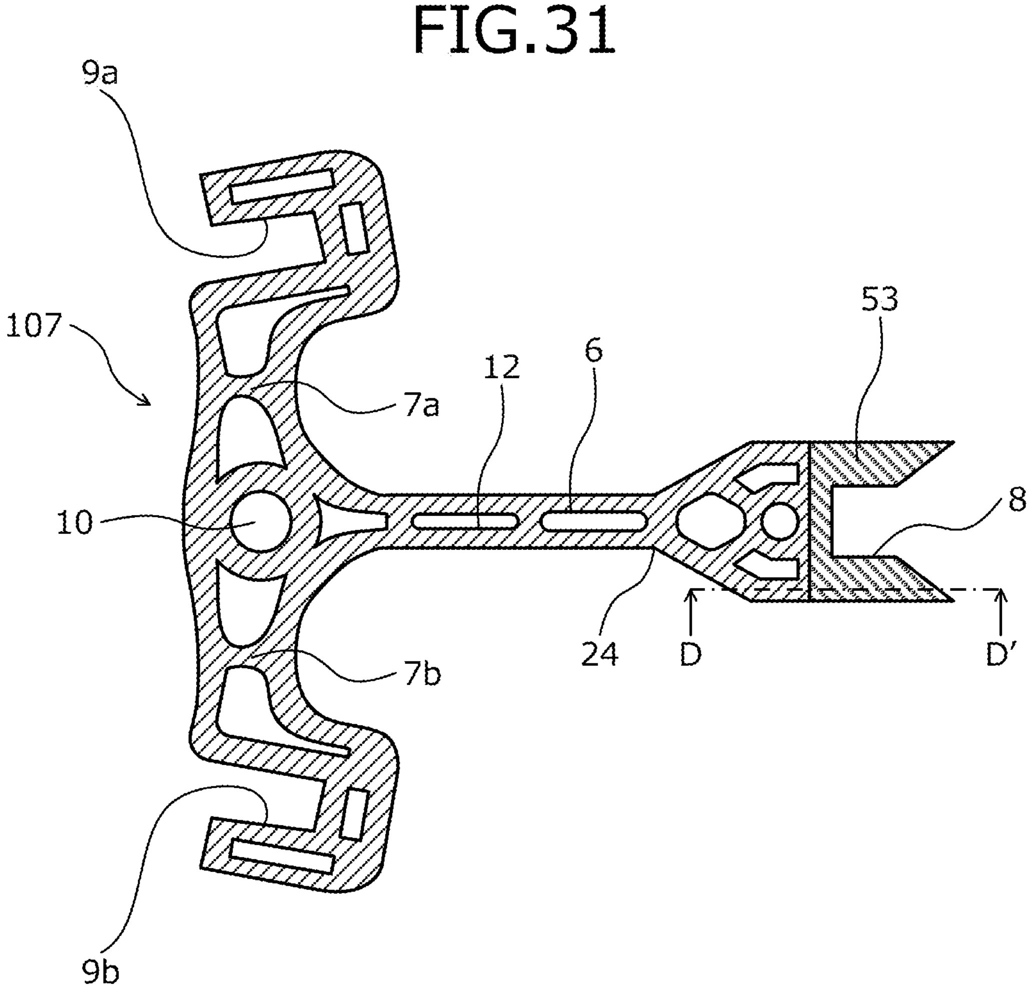
FIG. 31 is an explanatory view of a structure of an anchor of a fifth embodiment.
Figure 32:
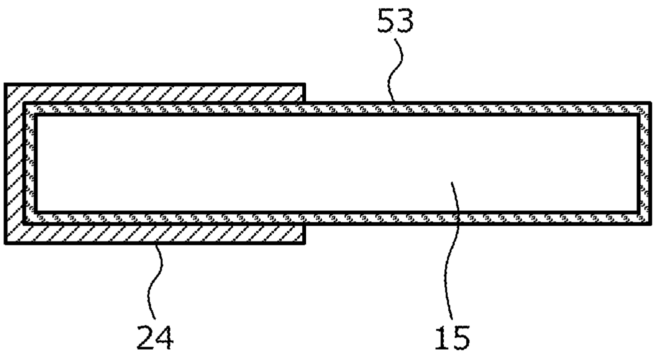
FIG. 32 is an explanatory view of a cross-section taken along D-D' in FIG. 31.

FIG. 31 is an explanatory view of the structure of the anchor 107 of the fifth embodiment. FIG. 31 depicts a plane view of the anchor 107 of the fifth embodiment in a direction of the arrow X of FIG. 1. FIG. 32 is an explanatory view of a cross-section taken along D-D' in FIG. 31. In FIGS. 31 and 32, the anchor 107 implements a component of the balance (speed governing mechanism) 104 of the mechanical timepiece.

The anchor 107 regularly advances and stops the escape wheel 106 attempting to rotate according to the power transmitted through the train wheel 105. The anchor 107 includes one beam portion 6 and two arm portions 7*a*, 7*b* extending in three respective different directions from a shaft hole 10 that is the rotation center of the anchor 107.

A box portion 8 opened in a U shape is provided at a tip of the beam portion 6. As an impulse pin performs a rotational reciprocating motion in a regular cycle according to the hairspring 108 (108*a* to 108*c*) and comes into contact with the box portion 8, the anchor 107 reciprocates in a regular cycle around the shaft hole 10.

Stone slots 9*a*, 9*b* are provided at tips of the arm portions 7*a*, 7*b*. Components called pallet stones are pushed and fixed into the stone slots 9*a*, 9*b*. The regular motion transmitted from the hairspring 108 (108*a* to 108*c*) through the impulse pin to the anchor 107 is transmitted to the escape wheel 106 by flicking the escape wheel 106 with the pallet stones so as to advance and stop the escape wheel 106.

In the balance 104 as described above, the transmission efficiency of the power generated by the hairspring 108 (108*a* to 108*c*) may be increased by achieving the weight reduction of the components. Therefore, in the anchor 107 of the fifth embodiment, silicon having a light weight and a favorable processability is used as the first material forming the base material 15 of the anchor 107.

As described above, since the anchor 107 of the fifth embodiment has the base material 15 formed by using silicon, the silicon forming the base material 15 may be processed by using the Deep RIE technique. For example, as depicted in FIG. 31, the anchor 107 in a hollow shape may be achieved easily by making a hole 12 in a portion of the anchor 107. The hole 12 penetrates the anchor 107 in a thickness direction. By forming the anchor 107 in a hollow shape, the weight can further be reduced in addition to a weight reduction achieved by forming the base material 15 from silicon.

The anchor 107 of the fifth embodiment may be prevented from being damaged due to a strength reduction attributable to hollowing, by forming an intermediate film 53 on the surface of the base material 15 and further forming a buffer film 24 as an upper layer on the intermediate film 53. In particular, by providing the intermediate film 53 formed by using the various materials described above on the surface of the base material 15, the brittleness of silicon may be alleviated and, additionally, by providing on the surface of the intermediate film 53 the buffer film 24 formed by using the second material having a tenacity higher than that of silicon used as the first material, external impact to the anchor 107 may be mitigated to prevent a damage such as cracking and chipping due to stress concentration at corners, etc.

The box portion 8 is a portion coming into direct contact with the impulse pin and, if the buffer film 24 is provided on the surface of the box portion 8, the transmission efficiency of the force from the impulse pin is reduced. Therefore, in the anchor 107, as depicted in FIG. 32, the buffer film 24 is partially not provided on the same component, such as the box portion 8 of the anchor 107, depending on purpose and function.

In the timepiece component such as the anchor 107, the interlayer 53 of the box portion 8 may be removed in addition to the buffer film 24 of the box portion 8 depending on the specifications of the mechanical timepiece using the timepiece component, so as to expose the first material (in this example, silicon) that is the base material 15. As a result, the force from the impulse pin may efficiently be transmitted to the escape wheel 106.

In the fifth embodiment, the anchor 107 is formed into a hollow shape by providing the multiple holes 12 penetrating along the thickness direction; however, the shape of the anchor 107 is not limited thereto. For example, as described in the third embodiment, a groove portion serving as a stepped portion may be provided on the surface of the anchor 107. As a result, the weight may be reduced further in addition to a weight reduction achieved by forming the base material 15 from silicon.

If the weight is reduced by providing the groove portion in this way, the buffer intermediate film 53 and the buffer film 24 may be provided along the shape of the groove portion or the groove portion may be filled with the buffer film 24. As a result, damage may be prevented from occurring due to reduced strength attributable to hollowing.

In the fifth embodiment, the anchor 107 is taken as an example of a timepiece component reduced in weight by hollowing and prevented from being damaged due to a strength reduction attributable to hollowing in the description; however, this is not a limitation. Such a timepiece component may be achieved by other timepiece components such as gears (a wheel and pinion, an escape wheel) and a balance wheel, instead of, or in addition to, the anchor 107.

Sixth Embodiment

A gear will be described as a drive mechanism of a timepiece incorporating a timepiece component of a sixth embodiment according to the present invention manufactured by a manufacturing method according to the sixth embodiment according to the present invention. In the sixth embodiment, portions identical to those of the first to fifth embodiments described above are denoted by the same reference characters used in the first to fifth embodiments and will not be described.

Figure 33:
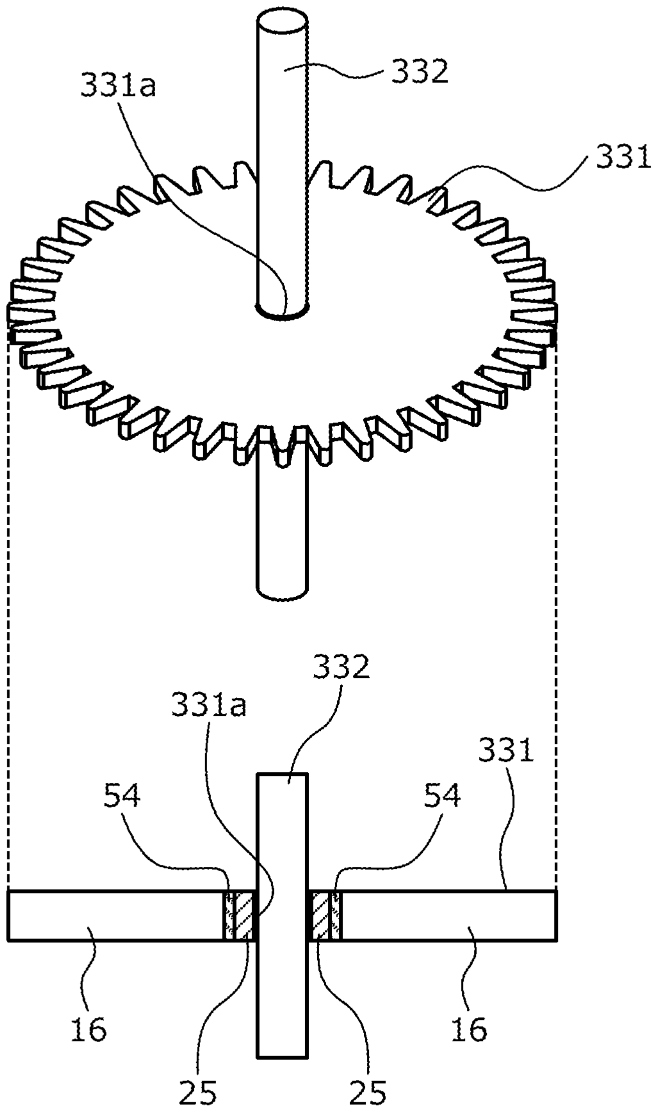
FIG. 33 is an explanatory view of a structure of a gear of a sixth embodiment.

FIG. 33 is an explanatory view of the structure of the gear of the sixth embodiment. In FIG. 33, a gear 331 of the sixth embodiment includes a shaft hole 331*a* into which a shaft 332 is fitted. The gear 331 includes a base material 16 formed by using silicon. An intermediate film 54 is provided on a surface of the base material 16 located on an inner circumferential surface of the shaft hole 331*a*. The intermediate film 54 may be formed by using the various materials described above. A buffer film 25 formed by using the second material is provided as an upper layer on the intermediate film 54.

As described above, in the gear 331 of the sixth embodiment, by using silicon to form the base material 16, the weight of the gear 331 is reduced and, by providing the intermediate film 54 and the buffer film 25 on the inner circumferential surface of the shaft hole 331, external impact to the gear 331 may be mitigated to prevent a damage such as cracking and chipping due to stress concentration on corners etc.

Seventh Embodiment

An electret will be described as a timepiece component of a seventh embodiment according to the present invention manufactured by a manufacturing method according to the seventh embodiment according to the present invention. In the seventh embodiment, portions identical as those of the first to sixth embodiments described above are denoted by the same reference characters used in the first to sixth embodiments and will not be described.

Figure 34:
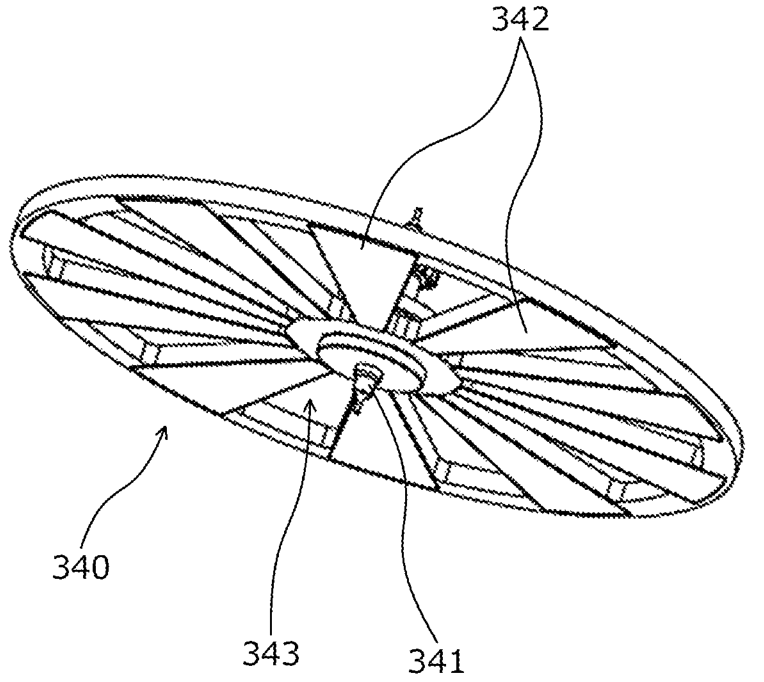
FIG. 34 is an explanatory view (part 1) of an electret of the sixth a seventh embodiment according to the present invention.
Figure 35:
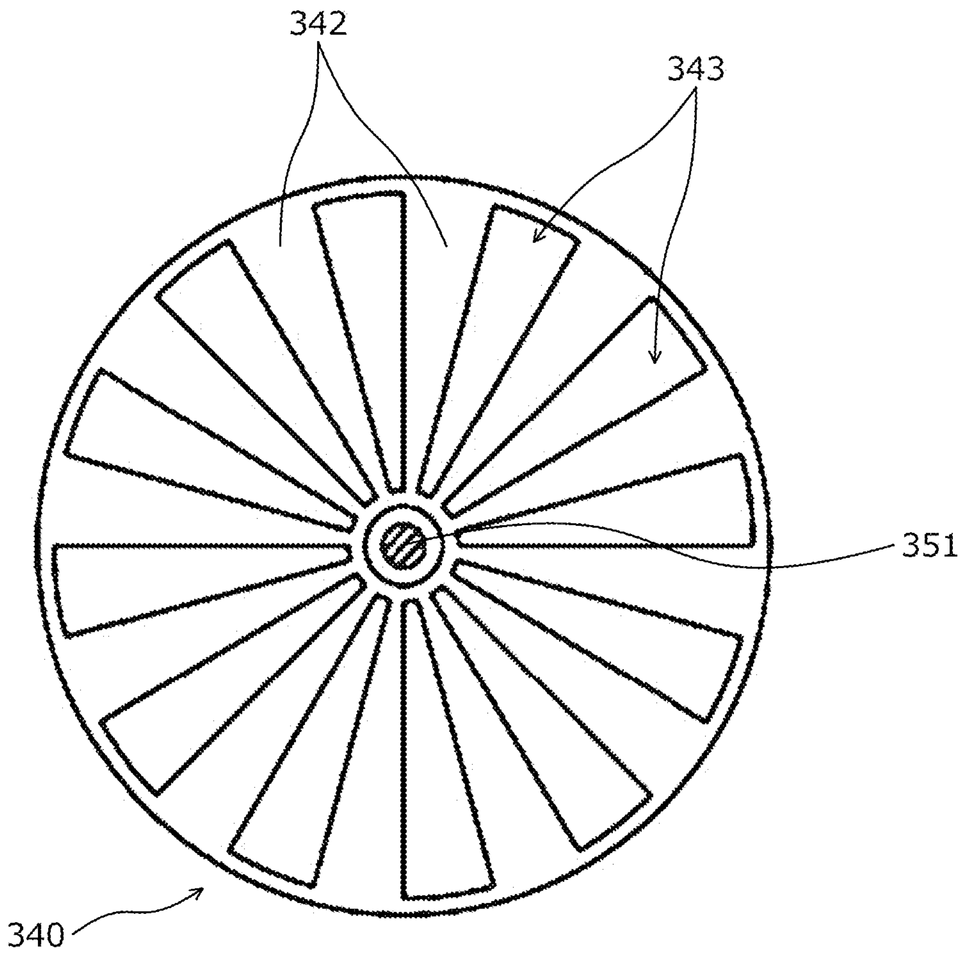
FIG. 35 is an explanatory view (part 2) of the electret of the sixth seventh embodiment according to the present invention.

FIGS. 34 and 35 are explanatory views of the electret of the seventh embodiment according to the present invention. FIG. 34 depicts the electret viewed in an oblique direction, and FIG. 35 depicts the electret viewed from the front. In FIGS. 34 and 35, an electret 340 is a charged object formed of a substance having dielectric polarization remaining (continuously forming an electric field) even when an electric field is eliminated in a dielectric substance dielectrically polarized by applying an electric field, and is used in a power generator, etc. not depicted.

The electret 340 includes a shaft hole 351 into which a shaft 341 is fitted. The electret 340 includes charged bodies 342 arranged radially from the shaft 341, around the shaft 341. Charged films are provided on front surfaces of the charged bodies 342. The charged films are positively or negatively charged by being subjected to a treatment such as corona discharge.

Openings 343 are provided between the charged bodies 342 along the circumferential direction of a circle around the shaft 341. As a result, the electret 340 may be reduced in weight. The charged bodies 342 are connected to the shaft 341 via an elastic member not depicted. The electret 340 is configured to perform an oscillating motion around the shaft 341 when vibration is externally applied.

The electret 340 of the sixth embodiment includes a base material formed by processing a silicon substrate by using the Deep RIE technique. The shape of the electret 340 is formed by the base material. The electret 340 has an intermediate film and a buffer film (both not depicted) provided at positions other than the portions provided with the charged films, i.e., other than the front surfaces of the charged bodies 342. The intermediate film and the buffer film are provided in all the portions other than the portions provided with the charging films and are also provided on the inner circumferential surface of the shaft hole 351.

The intermediate film is provided to cover the surface of the base material of the electret 340 other than the front surfaces of the charged bodies 342. The buffer film is stacked as an upper layer on the intermediate film and is provided to cover the charged bodies 342 except the front surfaces. The intermediate film and the buffer film are respectively formed by using the same materials as those in the embodiments described above.

While a weight reduction is required, the electret 340 described above is an extremely fine component and therefore may cause a concern about reduced resistance to external impact when formed by using silicon, etc. Since the electret 340 of the sixth embodiment has the intermediate film and the buffer film provided at positions other than the front surfaces of the charged bodies 342 on the surface of the base material, a weight reduction may be achieved by forming the base material from silicon while the external impact may be mitigated by the intermediate film and the buffer film.

Additionally, the electret 340 has the intermediate film and the buffer film provided on the inner circumferential surface of the shaft hole 351 so that the inner circumferential surface of the shaft hole 351 and the outer circumferential surface of the shaft 341 come into contact with each other via the buffer film. As a result, even if an impact is applied to the electret 340 when the shaft 341 is fitted into the shaft hole 351, the impact may be mitigated. Therefore, the electret 340 may be prevented from breaking or cracking when the shaft 341 is fitted into the shaft hole 351.

Eighth Embodiment

A shaft stone will be described as a timepiece component of an eighth embodiment according to the present invention manufactured by a manufacturing method according to the eighth embodiment according to the present invention. In the eighth embodiment, portions identical to those of the first to seventh embodiments described above are denoted by the same reference characters used in the first to seventh embodiments and will not be described.

Figure 36:
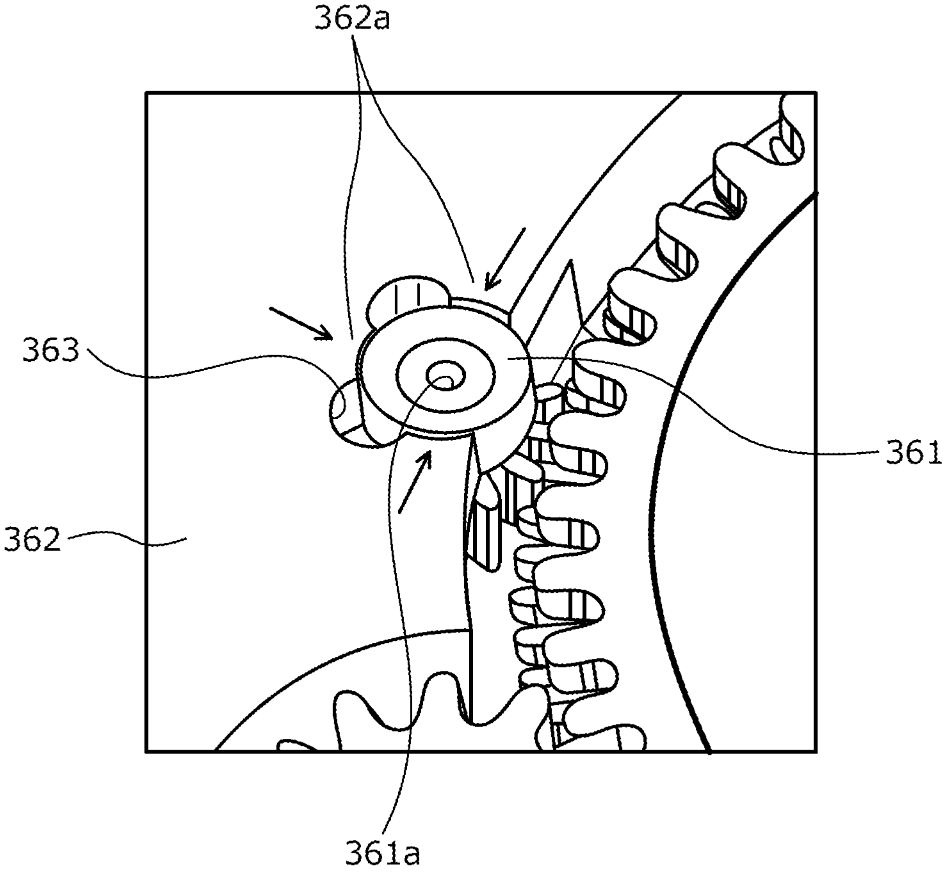
FIG. 36 is an explanatory view (part 1) of a portion of a drive mechanism in a mechanical timepiece.
Figure 37:
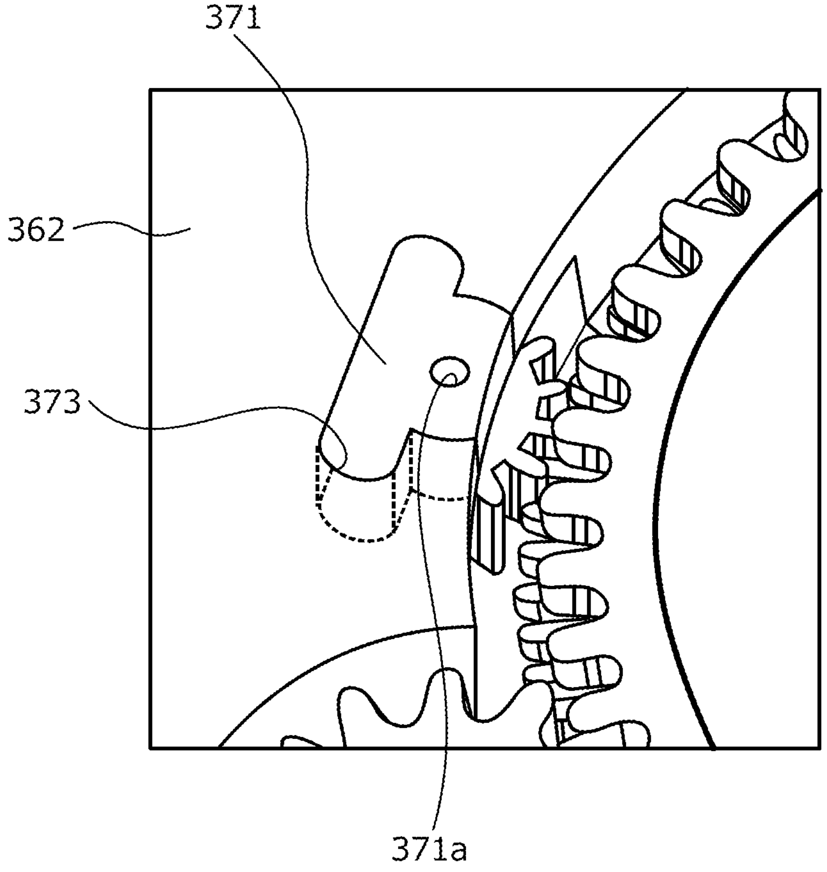
FIG. 37 is an explanatory view (part 2) of a portion of a drive mechanism in a mechanical timepiece.

FIGS. 36 and 37 are explanatory views of a portion of the drive mechanism in the mechanical timepiece. In FIG. 36, the drive mechanism in the mechanical timepiece includes a shaft stone 361 that is a bearing formed of a stone such as ruby. The shaft stone 361 depicted in FIG. 36 has a disk shape, and a shaft hole 361*a* is formed in a center portion.

In the mechanical timepiece, for example, as depicted in FIG. 36, a cutout 363 is formed in a bottom plate 362, and the shaft stone 361 is held by fitting the shaft stone 361 into the cutout 363. The cutout 363 includes projecting portions 362*a* projecting to come into contact with the shaft stone 361 at multiple positions and forms a shape different from the shape of the outer surface of the shaft stone 361.

Rather than being in the same shape to which the shaft stone 361 is exactly fitted into the cutout 363, the cutout 363 allows the multiple projecting portions 362*a* projecting toward the inside of the cutout 363 to come into contact with the outer circumferential surface of the shaft stone 361 so as to support the shaft stone 361. The cutout 363 causes a contact force to act on the shaft stone 361 via the projecting portions 362*a* in directions indicated by arrows so as to support the shaft stone 361.

When the shaft stone 361 is held by causing the projecting portions 362*a* to come into contact with the shaft stone 361, the projecting portions 362*a* must be brought into strong contact with the shaft stone 361 for reliable holding; however, the strong contact places a burden on the shaft stone 361 at the positions of contact with the projecting portions 362*a*. On the other hand, if the contact force of the projecting portions 362*a* against the shaft stone 361 is weak, it is difficult to sufficiently hold the shaft stone 361. Particularly when the shaft stone 361 is arranged at the outer end portion (outer edge) of the bottom plate 362, it is difficult to hold the shaft stone 361.

In this regard, the shaft stone 361 of the eighth embodiment is formed by providing an intermediate film on a surface of a base material formed by using ruby, silicon, etc. as a first material and providing a buffer film as an upper layer on the intermediate film (detailed illustrations and reference characters of both films are not depicted). Thus, the base material of the shaft stone 361 is covered with the interlayer film and the buffer film.

By achieving the shaft stone 361 having the intermediate film and the buffer film provided on the surface of the base material in this way, the shaft stone 361 may be held reliably without damaging the shaft stone 361 even when the projecting portions 362*a* are brought into strong contact with the shaft stone 361 so as to strongly hold the shaft stone 361.

The shaft stone 361 is not limited to the shape depicted in FIG. 36. For example, the shaft stone 361 having the shape depicted in FIG. 36 may be replaced with a shaft stone 371 having a shape as depicted in FIG. 37. The shaft stone 371 is supported by being fitted into a cutout 373 cut inward from the end portion (outer edge) of the bottom plate 362 and widened laterally inside the bottom plate 362. The shaft stone 371 has the same shape as the cutout 373 and forms a substantially T shape widened laterally on the inner side of the end portion of the bottom plate 362. The shaft stone 371 has a shaft hole 371*a* formed at a position shifted from the center portion toward an end. By using the shaft stone 371 acquired by processing a silicon material with photolithography, such a different shape is easily fabricated.

By using the shaft stone 371 and the cutout 373 having such a shape, the shaft stone 371 may be held stably. As a result, the shaft hole 371*a* may be arranged at a position close to the end portion (outer edge) of the bottom plate 362. The shape of the shaft stone is not limited to the shapes depicted in FIGS. 36 and 37 and, for example, a triangular shaft stone may be supported by the bottom plate 362 such that a vertex is arranged at the end portion (outer edge) of the bottom plate 362. Such a triangular shaft stone may have a shaft hole provided in the vertex arranged at the end portion (outer edge) of the bottom plate 362.

Ninth Embodiment

A backlash compensating member will be described as a timepiece component of a ninth embodiment according to the present invention manufactured by a manufacturing method according to the ninth embodiment according to the present invention. The backlash compensating member is provided in a mechanism mutually engaged with a gear (or screw) to transmit a motion such as the train wheel 105 and a screw in the mechanical timepiece so as to compensate a gap (so-called backlash) intentionally provided in the direction of motion of the gear (or screw) in the mechanism. The backlash compensating member is described as a conventional technique in Japanese Patent No. 4851945, for example.

The backlash compensating member is provided, for example, at a position of a tooth (or screw thread) at which a gear (or screw) is engaged with an engagement counterpart. Alternatively, the backlash compensating member is provided between the gear (or screw) and the engagement counterpart. The backlash compensating member includes a tooth portion engaged with the gear (or screw), and rotates in conjunction with the gear (or screw) when the rotation of the gear (or screw) is transmitted through the tooth portion. The tooth portion is configured to elastically deform with respect to the rotation direction. This allows the backlash compensating member to compensate a backlash between the gear (or screw) and the engagement counterpart.

In this backlash compensating member, at least the tooth portion is made up of a base material, and the intermediate and buffer films described above are provided on the tooth portion made up of the base material. As a result, an impact caused by transmission of power of the gear (or screw), etc. may be mitigated so as to prevent cracking or chipping of the backlash compensating member attributable to a stress concentrating at the tooth portion due to a collision of the gear (or screw) against the tooth portion of the backlash compensating member. Additionally, by providing the buffer film, the impact may be mitigated, so that the backlash compensating member and the gear or the screw, etc. colliding with the backlash compensating member may be prevented from being damaged.

INDUSTRIAL APPLICABILITY

As described above, the timepiece component and the method of manufacturing a timepiece component according to the present invention are useful for a timepiece component constituting a mechanical component in a timepiece and a method of manufacturing the timepiece component and is particularly suitable for a timepiece component used in a speed governing mechanism of a mechanical timepiece and a method of manufacturing the timepiece component.

EXPLANATIONS OF LETTERS OR NUMERALS

108, 108*a*, 108*b*, 108*c* hairspring
2 spring unit
3 collet
4 stud
107 anchor
6 beam portion
7*a*, 7*b* arm portion
8 box portion
9*a*, 9*b* stone slot
10 shaft hole
11*a*-11*d*, 13*a*-13*d* base material
21*a*-21*d*, 22*a*-22*d*, 23*a*-23*d*, 24*a*-24*d*, 25*a*-25*d* buffer film
31 through-hole
32 connection portion
51*a*-51*d*, 52*a*-52*d*, 53*a*-53*d*, 54, 55*a*-55*d* intermediate film
60, 61, 62 silicon substrate
80 side surface
81, 82 flat surface
331 gear
331*a* shaft hole
340 electret
341 shaft
342 charged body
351, 361*a*, 371*a* shaft hole
361, 371 shaft stone
362 bottom plate
363, 373 cutout
500, 510, 520, 530 exposure mask

The invention claimed is:

1. A timepiece component of a drive mechanism for driving hands of a mechanical timepiece, comprising:
a base material consisting of silicon;
an intermediate film comprising copper and provided on at least a portion of a surface of the base material; and
a buffer film which is stacked on the intermediate film and is an electrodeposition resist made of an acrylic resin.

2. The timepiece component according to claim 1, wherein
the base material includes a stepped portion on an outer surface, and
the intermediate film is provided at a position covering at least the stepped portion.

3. The timepiece component according to claim 1, wherein
the timepiece component is a hairspring of a speed governing mechanism of the drive mechanism of the mechanical timepiece.

4. The timepiece component according to claim 3, wherein the buffer film is formed on an outermost surface of the hairspring.

5. The timepiece component according to claim 1, wherein
the timepiece component is one of a gear, an anchor, or a balance wheel of the drive mechanism of the mechanical timepiece, and the timepiece component has a hole configured to receive another member.

6. The timepiece component according to claim 1, wherein
the base material has a corner,
a portion of the intermediate film covers the corner, and
a portion of the buffer film is stacked on the portion of the intermediate film that covers the corner.

7. The timepiece component according to claim 6, wherein
the intermediate film covers an entirety of the base material.

8. The timepiece component according to claim 1, wherein the buffer film has a constant thickness.

9. The timepiece component according to claim 1, wherein the intermediate film has a higher toughness than the base material.

10. The timepiece component according to claim 1, wherein each of an end of a first surface of the base material and a second surface of the base material is provided with a groove portion having a predetermined width and a predetermined depth, wherein the intermediate film is provided at least at an inner surface of the groove portion.

11. A method of manufacturing a timepiece component of a drive mechanism for driving hands of a mechanical timepiece, the method comprising:
forming a base material consisting of silicon into a shape of the timepiece component of the drive mechanism of the mechanical timepiece by etching a substrate;
forming an intermediate film comprising copper on at least a portion of a surface of the base material; and
forming a buffer film by stacking, on the intermediate film, an electrodeposition resist made of an acrylic resin.

12. The method according to claim 11, comprising
forming a stepped portion on the surface of the base material, wherein
the forming of the intermediate film is performed after the forming of the stepped portion.

13. The method according to claim 11, wherein
the forming of the buffer film includes forming the buffer film by applying a predetermined voltage to the intermediate film after the base material having the intermediate film formed thereon is immersed in an electrodeposition liquid including an electrodeposition resist comprising an acrylic resin.

14. The method according to claim 11, wherein the timepiece component is a hairspring of a speed governing mechanism of the drive mechanism of the mechanical timepiece, and the buffer film is formed on an outermost surface of the hairspring.

15. The method according to claim 11, wherein the buffer film has a constant thickness.

* * * * *